United States Patent
Inoue et al.

(10) Patent No.: US 8,681,192 B2
(45) Date of Patent: Mar. 25, 2014

(54) SENSOR DEVICE AND ELECTRONIC APPARATUS

(75) Inventors: Takahiro Inoue, Osaka (JP); Isamu Kawabe, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 183 days.

(21) Appl. No.: 13/346,311

(22) Filed: Jan. 9, 2012

(65) Prior Publication Data

US 2012/0188292 A1   Jul. 26, 2012

(30) Foreign Application Priority Data

Jan. 21, 2011   (JP) ................. 2011-004169

(51) Int. Cl.
*G09G 5/10* (2006.01)
(52) U.S. Cl.
USPC ........... 345/690; 345/207; 345/697; 345/699; 345/211
(58) Field of Classification Search
USPC ......... 345/690, 207, 697, 699, 211, 419, 173; 356/425; 600/324; 463/16; 378/62
See application file for complete search history.

(56) References Cited

U.S. PATENT DOCUMENTS

| | | | | |
|---|---|---|---|---|
| 4,928,692 A | * | 5/1990 | Goodman et al. | 600/324 |
| 6,147,761 A | * | 11/2000 | Walowit et al. | 356/425 |
| 2004/0156473 A1 | * | 8/2004 | Nonaka et al. | 378/62 |
| 2010/0127159 A1 | | 5/2010 | Watanabe | |
| 2010/0289835 A1 | * | 11/2010 | Holub | 345/690 |
| 2010/0311489 A1 | * | 12/2010 | Miller et al. | 463/16 |
| 2011/0007048 A1 | * | 1/2011 | Fratti et al. | 345/207 |
| 2011/0043471 A1 | * | 2/2011 | Senda et al. | 345/173 |
| 2011/0057930 A1 | * | 3/2011 | Keller et al. | 345/419 |
| 2012/0019493 A1 | * | 1/2012 | Barnhoefer et al. | 345/207 |

FOREIGN PATENT DOCUMENTS

| | | |
|---|---|---|
| JP | 59-202731 A | 11/1984 |
| JP | 63-193382 U | 12/1988 |
| JP | 3-123120 A | 5/1991 |
| JP | 3-141028 A | 6/1991 |
| JP | 5-327616 A | 12/1993 |
| JP | 2001-160756 A | 6/2001 |
| JP | 2003-87107 A | 3/2003 |
| JP | 2010-127635 A | 6/2010 |

* cited by examiner

*Primary Examiner* — Thuy Pardo
(74) *Attorney, Agent, or Firm* — Birch, Stewart, Kolasch & Birch, LLP

(57) ABSTRACT

The present invention provides a sensor device and an electronic apparatus each of which does not make malfunction derived from outside ambient light such as sunlight. In the sensor device, an ADC outputs, to one of two input terminals of a comparison circuit, second data which is a digital value ADCOUT corresponding to a current Iin−I1 being the result of subtraction from a current I1 from a current Iin and which is larger than a threshold Data_th.

20 Claims, 18 Drawing Sheets

FIG. 15        Prior Art
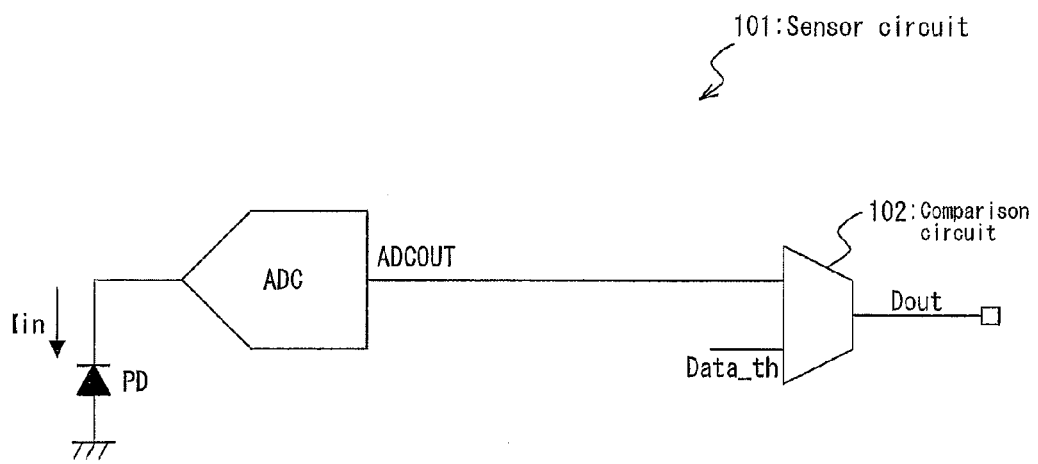
FIG. 16        Prior Art
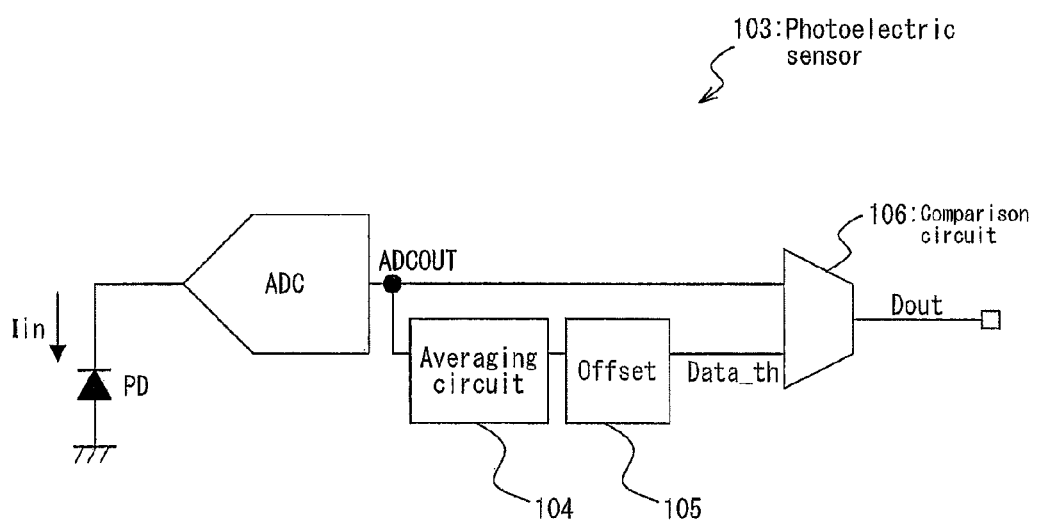

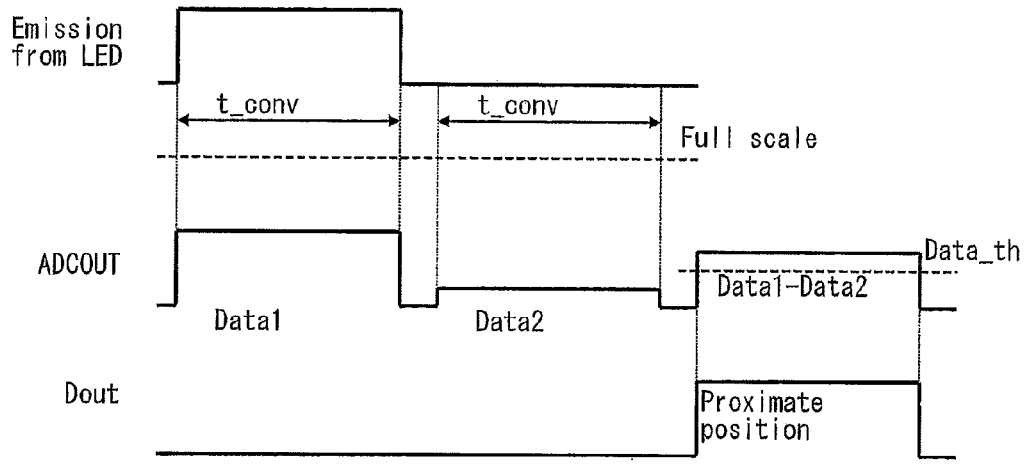
FIG. 19 (a) Prior Art
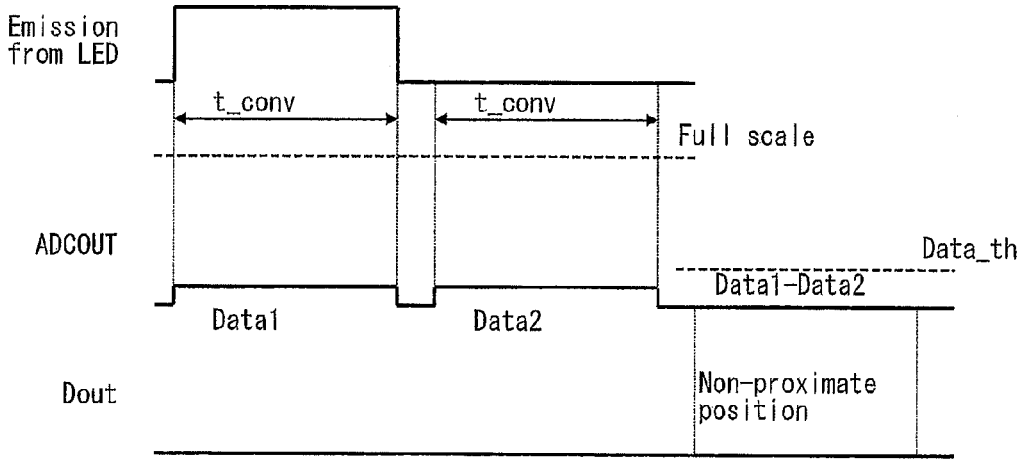
FIG. 19 (b) Prior Art

SENSOR DEVICE AND ELECTRONIC APPARATUS

This Nonprovisional application claims priority under 35 U.S.C. §119(a) on Patent Application No. 2011-004169 filed in Japan on Jan. 12, 2011, the entire contents of which are hereby incorporated by reference.

TECHNICAL FIELD

The present invention relates to a sensor device and an electronic apparatus each capable of determining whether a detection target is positioned proximately or not.

BACKGROUND ART

There is an increasing demand that liquid crystal panels used in mobile phones, digital cameras etc. have proximity sensors in order to be made off when a user's face is positioned proximately to the liquid crystal panels, thereby reducing power consumption. Further, there is also a demand that the proximity sensors be used as range-finding sensors since output values of the proximity sensors are inversely proportional to detected distances. Further, there is also a demand that liquid crystal panels used in mobile phones, digital cameras etc. have illuminance sensors in order to control intensity of light from backlights of the liquid crystal panels in accordance with illuminance of disturbing light.

On the other hand, integrating-type analog-to-digital conversion circuits have a feature that they can realize high resolution with a simple configuration. This feature is desirable for devices which are slow in motion but are required to have high resolution (approximately 12-16 bits). Mounting both of an illuminance sensor and a proximity sensor on a device raises a problem that, for example, the device is required to have a larger size. Accordingly, there is an increasing demand that a single device is configured to detect both illuminance and proximity/non-proximity of an object.

FIG. 15 shows a first conventional example which is a general configuration of a sensor circuit 101 including an analog-to-digital conversion circuit. In the sensor circuit 101, an analog-to-digital conversion section ADC is an analog-to-digital conversion circuit which digitally converts the amount of current Iin outputted from a photodiode PD and outputs a digital value ADCOUT. The sensor circuit 101 includes a comparison circuit 102 (comparison section) for comparing the digital value ADCOUT which is the result of measurement with a threshold Data_th. The result of the comparison is outputted as a digital output signal Dout to the outside.

FIG. 16 shows a second conventional example which is a configuration of a photoelectric sensor to which the teaching of Patent Literature 1 was applied. The photoelectric sensor 103 includes a photodiode PD, an averaging circuit 104 (operation section), an offset value setting section 105, and a comparison circuit 106. The photodiode PD outputs a current Iin to an ADC (Analog-to-Digital Converter). The averaging circuit 104 generates moving average values of periodically obtained measurement values. The offset value setting section 105 makes addition or multiplication with respect to the moving average. The offset value setting section 105 adds an offset to the moving average or multiplies the moving average with an offset so as to obtain a threshold Data_th. The comparison circuit 106 compares the threshold Data_th with the digital value ADCOUT. The photoelectric sensor 103 can make accurate detection regardless of changes in external environmental conditions and changes derived from temperature change in a sensor.

FIG. 17 shows a third conventional example which is a configuration of an analog-to-digital conversion circuit 107 to which the teaching of Patent Literature 2 was applied. The analog-to-digital conversion circuit 107 includes a differential amplifier 108, a capacitor C, a constant current circuit 109, an oscillator 110, a counter 111, and a control circuit 112. The differential amplifier 108 constitutes a voltage follower, and an input voltage Vin is inputted to a non-inverting input terminal (+) of the differential amplifier 108. The capacitor C stores charges corresponding to the input voltage Vin. The constant current circuit 109 discharges the charges stored in the capacitor C. The counter 111 counts clock pulses from the oscillator 110 from beginning of dissipation of the charges until voltages at both ends of the capacitor C are constant. The control circuit 112 controls operations of the oscillator 110 and the counter 111. The analog-to-digital conversion circuit 107 can make analog-to-digital conversion of the input voltage Vin by use of a simple configuration.

Recently, proximity sensors are designed to include integrating-type analog-to-digital conversion circuits and circuits for driving light emitting diodes. FIG. 18 shows a configuration of a general proximity sensor to which the teaching of Patent Literature 3 was applied. The proximity sensor 113 includes a photodiode PD, a light emitting diode LED, and a control circuit 114. In the proximity sensor 113, the control circuit 114 drives the light emitting diode LED, the photodiode PD for light reception converts the light to a current, and the control circuit 114 determines whether a detection target 115 is positioned proximately to the proximity sensor 113 or not.

The proximity sensor 113 shown in FIG. 18 includes the sensor circuit 101 shown in FIG. 15. A sensor including the proximity sensor 113 is an illuminance sensor capable of determining whether measured illuminance exceeds a predetermined threshold Data_th or not.

FIG. 19(a) is a waveform chart showing a case where the detection target 115 is positioned proximately to the general proximity sensor 113 shown in FIG. 18. FIG. 19(b) is a waveform chart showing a case where the detection target 115 is not positioned proximately to the general proximity sensor 113 shown in FIG. 18. A difference between data Data1 during a period of driving the light emitting diode LED and data Data2 during a period of not driving the light emitting diode LED is referred to as difference data Data1−Data2. Broken lines in FIGS. 19(a) and 19(b) represent the full scale of the digital value ADCOUT. In the drawings below, when the digital value ADCOUT reaches the full scale, the digital value ADCOUT is saturated in the ADC of FIG. 15.

In a case where the detection target 115 exists, reflected light 116 resulting from reflection of light from the light emitting diode LED by the detection target 115 is intense. Consequently, the current from the photodiode PD is large, so that the difference data Data1−Data2 exceeds the threshold Data_th of the control circuit 114. As a result, a digital output signal Dout in a Hi level is outputted and the detection target 115 is properly determined (judged) as being positioned proximately to the proximity sensor 113 (FIG. 19(a)).

In a case where the detection target 115 does not exist, the reflected light 116 is weak, so that the current from the photodiode PD is small. Consequently, the difference data Data1−Data2 does not exceed the threshold Data_th of the control circuit 114. As a result, the digital output signal Dout in a Low level is outputted and the detection target 115 is properly determined as not being positioned proximately to the proximity sensor 13 (FIG. 19(b)).

Further, since a value measured by the proximity sensor is inversely proportional to the square of a detected distance, calculating the detected distance from the measured value enables the proximity sensor to serve as a range-finding sensor.

CITATION LIST

Patent Literatures

[Patent Literature 1]
Japanese Patent Application Publication No. 2003-87107 (published on Mar. 20, 2003)
[Patent Literature 2]
Japanese Patent Application Publication No. 2001-160756 (published on Jun. 12, 2001)
[Patent Literature 3]
Japanese Patent Application Publication No. 2010-127635 (published on Jun. 10, 2010)

SUMMARY OF INVENTION

Technical Problem

Mobile phones and digital cameras are often used outside. Consequently, sensor devices mounted on the mobile phones and the digital cameras are irradiated with outside ambient light such as sunlight. In this case, when sunlight is intense, proximity sensors and range-finding sensors in the sensor devices may malfunction.

FIG. 20(a) is a waveform chart showing a case where the detection target 115 is positioned proximately to the general proximity sensor 113 shown in FIG. 18 irradiated with outside ambient light such as sunlight. FIG. 20(b) is a waveform chart showing a case where the detection target 115 is not positioned proximately to the general proximity sensor 113 shown in FIG. 18 irradiated with outside ambient light such as sunlight.

In a case where the detection target 115 exists, the reflected light 116 is intense, so that the current from the photodiode PD is large. It should be noted that the photodiode PD receives not only the reflected light 116 but also sunlight. Accordingly, data Data1 during a period of driving the light emitting diode LED includes addition (hatched part) derived from sunlight. Consequently, the data Data1 reaches its full scale, that is, the digital value ADCOUT is saturated in the ADC of FIG. 15. Further, data Data2 during a period of not driving the light emitting diode LED also includes addition (hatched part) derived from sunlight.

In the case where the detection target 115 exists, the difference data Data1−Data2 should exceed the threshold Data_th of the control circuit 114, as shown in FIG. 19(a). In contrast thereto, in FIG. 20(a), the digital value ADCOUT is saturated due to addition (hatched part) derived from sunlight, and consequently the difference data Data1−Data2 does not exceed the threshold Data_th of the control circuit 114, although the detection target 115 exists in reality. Consequently, the digital output signal Dout gets Low level which should be Hi level in reality, so that the detection target 115 is wrongly determined as not existing. That is, the proximity sensor 113 makes malfunction.

In the case shown in FIG. 20(a), the data Data1 includes a hatched part, which makes the data Data1 reach its full scale. When illuminance of sunlight is extremely high, even if the data Data1 includes only the hatched part, the data Data1 reach its full scale.

In this case, even if the data Data2 includes only the hatched part, the data Data2 reach its full scale, too. Accordingly, the difference data Data1−Data2 is 0 as a result of subtraction of the full-scaled hatched part from the full-scaled hatched part.

In the case where illuminance of sunlight is extremely high and merely including the hatched part makes the data Data1 and Data2 reach their full scales, the difference data Data1 Data2 is 0 which should exceed the threshold Data_th of the control circuit 114 in reality. Consequently, the difference data Data1−Data2 does not exceed the threshold Data_th. As a result, the detection target 115 is wrongly determined as not existing, although the detection target 115 exists in reality. That is, the proximity sensor 113 makes malfunction.

In the case where the detection target 115 does not exist, the reflected light 116 is weak, so that the current from the photodiode PD is small. Consequently, the difference data Data1−Data2 does not exceed the threshold Data_th (Data_th>0) of the control circuit 114. As a result, the digital output signal Dout in a Low level is outputted, and the detection target 115 is properly determined as not being positioned proximately to the proximity sensor 113 (FIG. 20(b)). However, the data Data1 and Data2 include additions (hatched parts) derived from sunlight.

The following explains problems seen in the first to third conventional examples. The problems include the aforementioned malfunction due to irradiation with outside ambient light such as sunlight.

In the configuration of the first conventional example, as shown in FIGS. 19(a) and 19(b), the difference between the data Data1 during a period of driving the light emitting diode LED and the data Data2 during a period of not driving the light emitting diode LED is considered as the difference data Data1−Data2. This enables determining whether the detection target is positioned proximately or not.

However, in a case where the sensor device is irradiated with outside ambient light such as sunlight, the digital value ADCOUT from the analog-to-digital conversion circuit is increased by the amount corresponding to the outside ambient light such as sunlight. When the sensor device is irradiated with sunlight in such an amount as to saturate the result of AD conversion by the analog-to-digital conversion circuit (in case of 16 bits, full scale 65535 counts), the sensor device makes malfunction as shown in FIG. 20(a). Consequently, the sensor device cannot accurately determine whether the detection target is positioned proximately or not.

In the configuration of the second conventional example, it is possible to make accurate detection regardless of changes in outside environmental conditions and changes due to temperature change in the sensor. In this case, an offset is added to a moving average or the moving average is multiplied with the offset so as to obtain a threshold. This enables accurately detecting a change in a measured value.

However, the sensor device of the second conventional example cannot make determination in a case where a measured value itself is required to be highly accurate. The case where a measured value itself is required to be highly accurate is, for example, a case where the sensor device is caused to operate as a range-finding sensor. In this case, the sensor device is required to calculate a value inversely proportional to the square of a detected distance. A difference in the measured values does not provide a value inversely proportional to the square of the detected distance, and consequently the sensor device cannot determine the detected distance.

Further, similarly with the configuration of the first conventional example, in a case where the sensor device is irradiated with outside ambient light such as sunlight, the digital value ADCOUT from the analog-to-digital conversion circuit is increased by the amount corresponding to the outside ambient light such as sunlight. This increase makes the sensor device malfunction in detection.

In the configuration of the third conventional example, it is possible to make analog-to-digital conversion of the input voltage Vin by use of a simple configuration.

However, also in the configuration of the third conventional example, similarly with the configurations of the first and second conventional examples, in a case where the sensor device is irradiated with outside ambient light such as sunlight, the digital value ADCOUT from the analog-to-digital conversion circuit is increased by the amount corresponding to the outside ambient light such as sunlight. This increase makes the sensor device malfunction in detection.

Solution to Problem

An object of the present invention is to provide a sensor device and an electronic apparatus each of which does not make malfunction derived from outside ambient light such as sunlight.

In order to solve the foregoing problem, a sensor device in accordance with one embodiment of the present invention is a sensor device capable of serving as a proximity sensor for determining whether a detection target is positioned proximately or not, comprising: a light emitting element for emitting, to a predetermined space, light to be reflected by the detection target positioned proximately; an analog-to-digital conversion section for subjecting an analog input current to analog-to-digital conversion; a light receiving element which is a photodiode, whose cathode is connected with an input terminal of the analog-to-digital conversion section and whose anode is grounded electrically; a comparison section for receiving, at one of two input terminals, a result of analog-to-digital conversion by the analog-to-digital conversion section and receiving a predetermined threshold at the other of the two input terminals, comparing the result with the predetermined threshold, and when the result is larger than the predetermined threshold, outputting a signal indicating that the detection target is positioned proximately and when the result is not larger than the predetermined threshold, outputting a signal indicating that the detection target is not positioned proximately; a storage section for storing the result; a change-over switch whose first terminal is connected with said one of the two input terminals of the comparison section, whose second terminal is connected with an input terminal of the analog-to-digital conversion section and an input terminal of the storage section, and whose third terminal is grounded electrically, the change-over switch connecting the first terminal with the second terminal or connecting the first terminal with the third terminal so as to make said one of the two input terminals of the comparison section grounded electrically; an open-close switch whose one end is connected with the cathode of the light receiving element and the input terminal of the analog-to-digital conversion section; a variable current source whose input terminal receives application of a power source voltage and whose output terminal is connected with the other end of the open-close switch; and a switch control section for outputting, to a control input terminal of the open-close switch, a first control signal for controlling opening and closing of the open-close switch and outputting, to a control input terminal of the change-over switch, a second control signal for controlling switching of the change-over switch.

With the arrangement, the light emitting element is turned off, the open-close switch is opened, and the change-over switch connects the first terminal with the third terminal so as to make said one of the two input terminals of the comparison section grounded electrically. This enables setting an output current from the variable current source.

Further, after setting the output current from the variable current source, the light emitting element is turned on, the open-close switch is closed, and the change-over switch connects the first terminal with the second terminal. Consequently, the result of analog-to-digital conversion is inputted to said one of the two input terminals of the comparison section.

As described above, with the arrangement, the light emitting element is turned on after setting the output current from the variable current source. This enables a difference current which is a difference between the output current from the variable current source and an output current from the light receiving element when the light emitting element is turned on to be supplied to the analog-to-digital conversion section.

The difference current is a current from which the output current from the variable current source was removed. The removed output current from the variable current source is equal to the output current from the light receiving element receiving the outside light when the light emitting element is turned off and the open-close switch is opened.

Consequently, determination of whether the detection target is positioned proximately or not can be made accurately since the influence of the outside light is removed.

Therefore, the present invention can provide a sensor device which does not make malfunction derived from outside ambient light such as sunlight.

In order to solve the foregoing problem, a sensor device in accordance with another embodiment of the present invention is a sensor device capable of serving as a proximity sensor for determining whether a detection target is positioned proximately or not, comprising: a light emitting element for emitting, to a predetermined space, light to be reflected by the detection target positioned proximately; an analog-to-digital conversion section for subjecting an analog input current to analog-to-digital conversion; a light receiving element which is a photodiode, whose cathode is connected with an input terminal of the analog-to-digital conversion section and whose anode is grounded electrically; a storage and subtraction section for storing a first input of the result of analog-to-digital conversion by the analog-to-digital conversion section, upon second input of the result of analog-to-digital conversion, outputting the first input of the result of analog-to-digital conversion, and upon third input of the result of the analog-to-digital conversion, outputting a subtraction value obtained by subtracting the third input of the result of analog-to-digital conversion from the second input of the result of analog-to-digital conversion, a comparison section for receiving, at one of two input terminals, an output from the storage and subtraction section and receiving a predetermined threshold at the other of the two input terminals, comparing the output from the storage and subtraction section with the predetermined threshold, and when the output from the storage and subtraction section is larger than the predetermined threshold, outputting a signal indicating that the detection target is positioned proximately and when the output from the storage and subtraction section is not larger than the predetermined threshold, outputting a signal indicating that the detection target is not positioned proximately; a storage section for storing the result of analog-to-digital conversion; a change-over switch whose first terminal is connected with an input terminal of the storage and subtraction section, whose second terminal is connected with an input terminal of the analog-to-digital conversion section and an input terminal of the storage section, and whose third terminal is grounded electrically, the change-over switch connecting the first terminal with the second terminal or connecting the first terminal with the third terminal so as to make the input terminal of the storage and subtraction section grounded electrically; an open-close switch whose one end is connected with the cathode of the light receiving element and the input terminal of the analog-to-digital conversion section; a variable current source whose input terminal receives application of a power source voltage and whose output terminal is connected with the other end of the open-close switch; and a switch control section for outputting, to a control input terminal of the open-close switch, a first control signal for controlling opening and closing of the open-close switch and outputting, to a control input terminal of the change-over switch, a second control signal for controlling switching of the change-over switch.

With the arrangement, the light emitting element is turned off, the open-close switch is opened, and the change-over switch connects the first terminal with the third terminal so as to make the input terminal of the storage and subtraction section grounded electrically. This enables setting an output current from the variable current source.

Further, after setting the output current from the variable current source, the light emitting element is turned on, the open-close switch is closed, and the change-over switch connects the first terminal with the second terminal. Consequently, the result of analog-to-digital conversion is inputted to the input terminal of the storage and subtraction section.

As described above, with the arrangement, the light emitting element is turned on after setting the output current from the variable current source. This enables a first difference current which is a difference between the output current from the variable current source and an output current from the light receiving element when the light emitting element is turned on to be supplied to the analog-to-digital conversion section.

Further, after the first difference current is supplied to the analog-to-digital conversion section, the light emitting element is turned off, the open-close switch is closed, and the change-over switch connects (i) the input terminal of the storage and subtraction section which input terminal is connected with the first terminal with (ii) the output terminal of the analog-to-digital conversion section which output terminal is connected with the second terminal. This enables a second difference current which is a difference between the output current from the variable current source and an output current from the light receiving element when the light emitting element is turned off to be supplied to the analog-to-digital conversion section.

The first and second difference currents are currents from which the output current from the variable current source was removed. The removed output current from the variable current source is equal to the output current from the light receiving element receiving the outside light when the light emitting element is turned off and the open-close switch is opened.

Consequently, determination of whether the detection target is positioned proximately or not can be made accurately since the influence of the outside light is removed.

Therefore, the present invention can provide a sensor device which does not make malfunction derived from outside ambient light such as sunlight.

BRIEF DESCRIPTION OF DRAWINGS

FIG. 2(*b*) is a waveform chart showing an operation waveform of the sensor device in accordance with Example 1 in a second case where the sensor device is not irradiated with outside ambient light such as sunlight and a detection target does not exist.

FIG. 3(*b*) is a waveform chart showing an operation waveform of the sensor device in accordance with Example 1 in a fourth case where the sensor device is irradiated with outside ambient light such as sunlight and a detection target does not exist.

FIG. 5(*b*) is a waveform chart showing an operation waveform of the sensor device in accordance with Example 2 in a sixth case where the sensor device is not irradiated with outside ambient light such as sunlight and a detection target does not exist.

FIG. 6(*b*) is a waveform chart showing an operation waveform of the sensor device in accordance with Example 2 in an eighth case where the sensor device is irradiated with outside ambient light such as sunlight and a detection target does not exist.

FIG. 7(*b*) is a waveform chart showing an operation waveform of the sensor device in accordance with Example 3 in a tenth case where the sensor device is not irradiated with outside ambient light such as sunlight and a detection target does not exist.

FIG. 8(*b*) is a waveform chart showing an operation waveform of the sensor device in accordance with Example 3 in a twelfth case where the sensor device is irradiated with outside ambient light with extremely high illuminance such as sunlight and a detection target does not exist.

FIG. 15 is a block diagram showing a general configuration of a sensor circuit using an analog-to-digital conversion circuit.

FIG. 16 is a block diagram showing a configuration of a photoelectric sensor to which the teaching of Patent Literature 1 was applied.

FIG. 19(a) is a waveform chart showing a case where a detection target is positioned proximately to the general proximity sensor in FIG. 18.

FIG. 19(b) is a waveform chart showing a case where a detection target is not positioned proximately to the general proximity sensor in FIG. 18.

DESCRIPTION OF EMBODIMENTS

Figure 1:
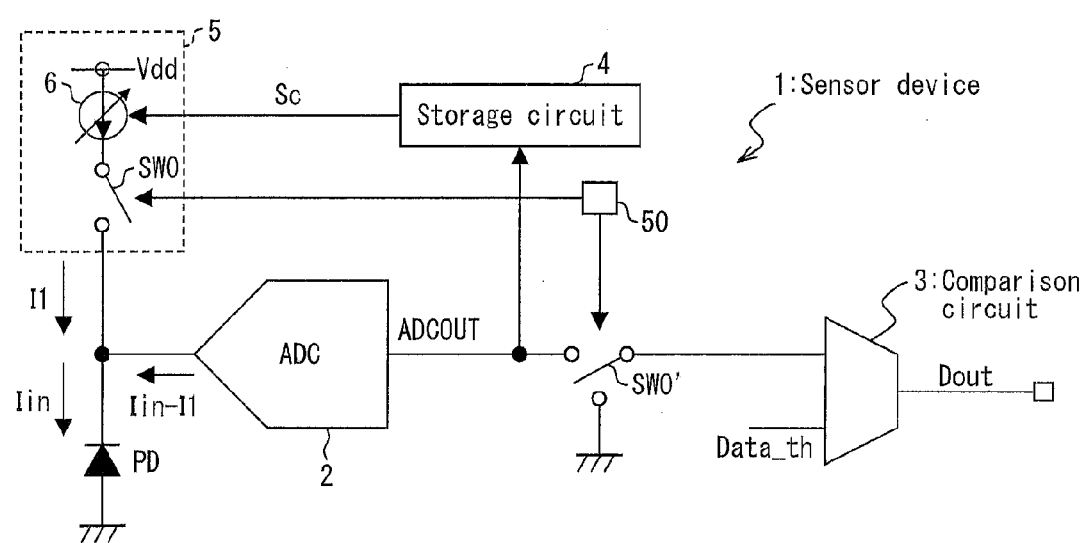
FIG. 1 is a block diagram showing a configuration of a sensor device in accordance with Example 1 of the present invention.
Figure 2:
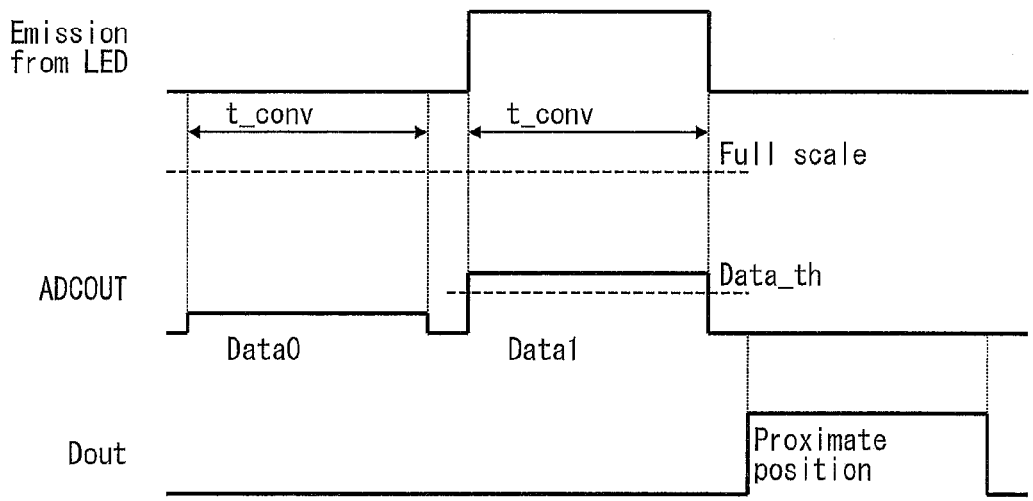
FIG. 2(*a*) is a waveform chart showing an operation waveform of the sensor device in accordance with Example 1 in a first case where the sensor device is not irradiated with outside ambient light such as sunlight and a detection target exists.
Figure 2:
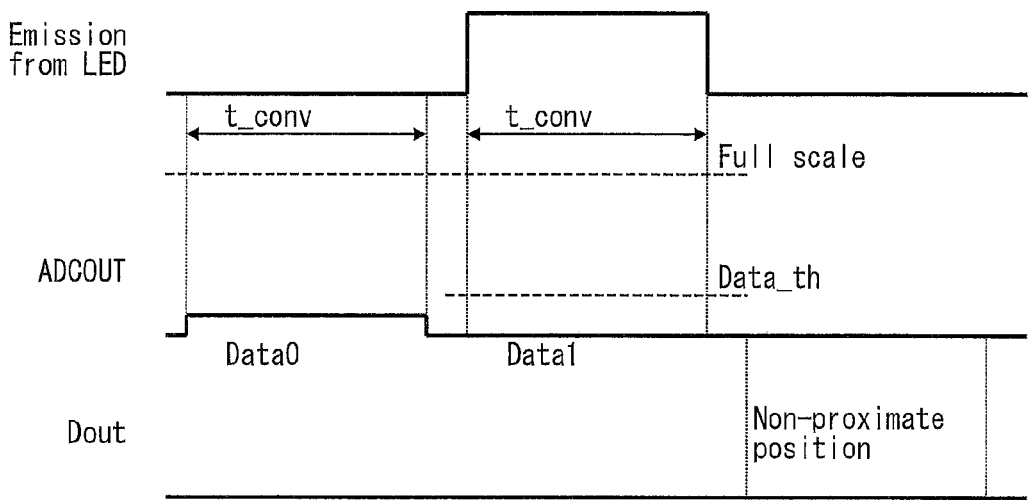
Figure 3:
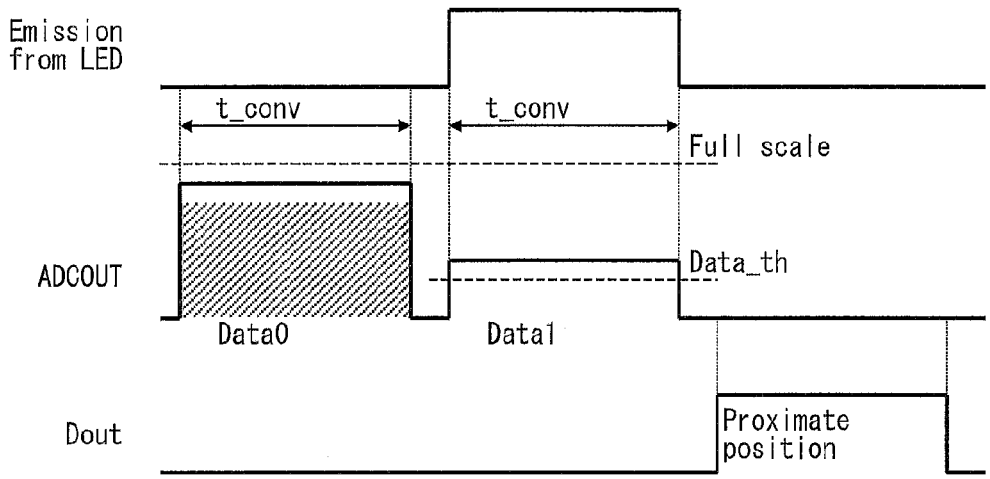
FIG. 3(*a*) is a waveform chart showing an operation waveform of the sensor device in accordance with Example 1 in a third case where the sensor device is irradiated with outside ambient light such as sunlight and a detection target exists.
Figure 3:
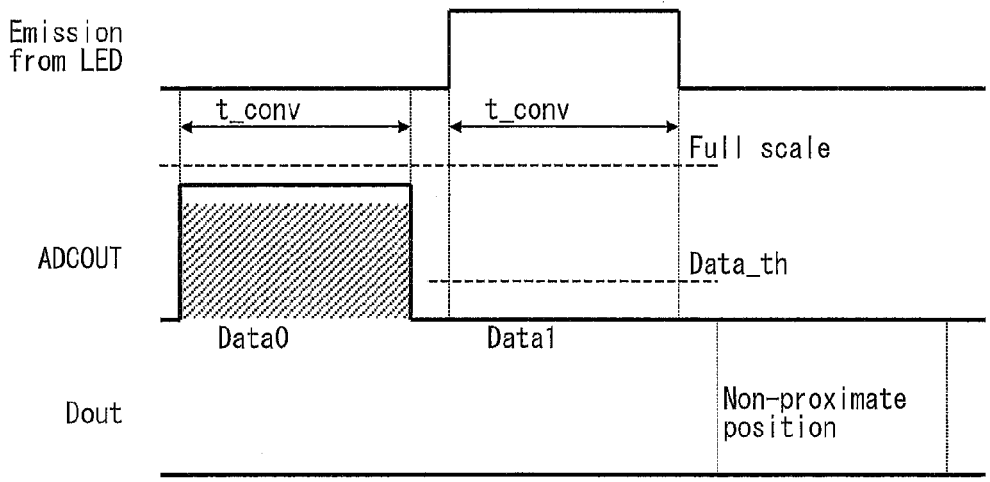

The following explains an embodiment of the present invention with reference to FIGS. 1 to 14. Initially, one example of the present invention is explained below.

Example 1

The following explains Example 1 of the present invention with reference to FIGS. 1-3(a), 3(b), and 12.

In Example 1, data during a period of not driving a light emitting diode LED is referred to as Data0 (first data). Data during a period of driving the light emitting diode LED is referred to as Data1 (second data). Broken lines shown in FIGS. 2(a) and 2(b) represent a full scale ((predetermined) upper limit) of a digital value ADCOUT (result of AD conversion) shown in FIG. 1. In the drawings below, in a case where the digital value ADCOUT reaches its full scale, the digital value ADCOUT is saturated in an ADC 2 (Analog-to-Digital Converter) shown in FIG. 1.

It should be noted that the digital value ADCOUT from the ADC 2 may be saturated by sunlight, whereas a current supplied from the photodiode PD in FIG. 1 to the ADC 2 does not get saturated either by sunlight or later-mentioned sunlight with extremely high illuminance.

(Sensor Device 1)

Figure 12:
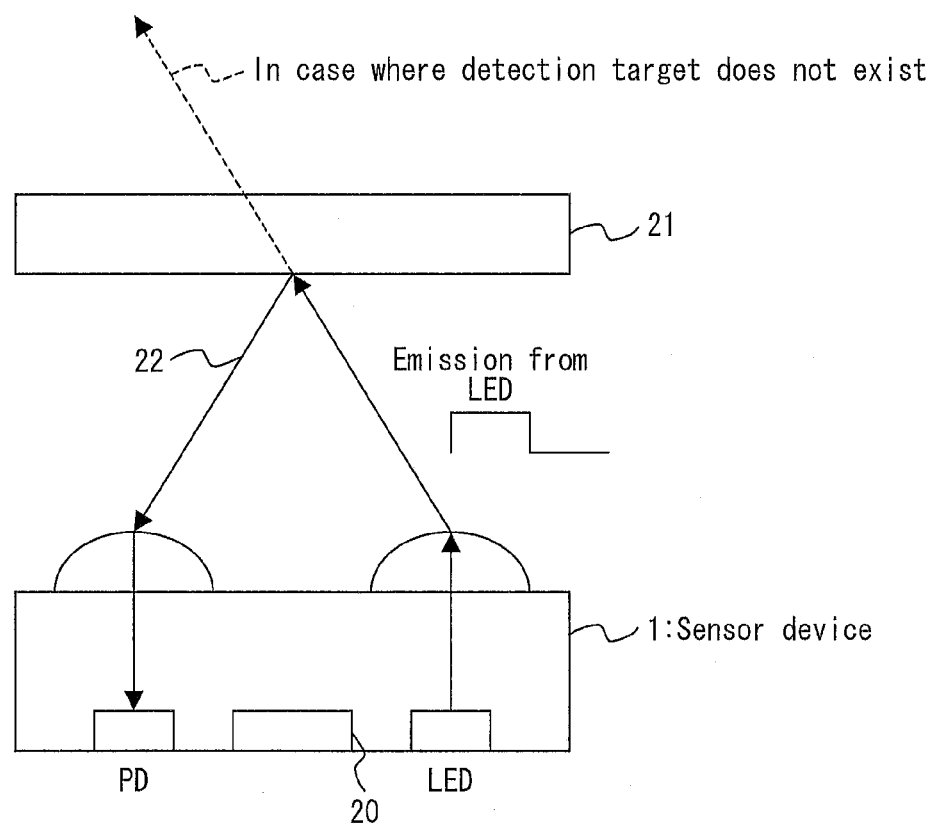
FIG. 12 is an elevation view showing a configuration of the sensor device in FIGS. 1 and 4.

FIG. 1 is a block diagram showing a sensor device 1 in accordance with the present embodiment. FIG. 12 is an elevation view showing a configuration of the sensor device 1 in accordance with the present embodiment. Initially, the configuration of the sensor device 1 is explained below with reference to FIG. 12.

As shown in FIG. 12, the sensor device 1 in accordance with the present embodiment includes a photodiode PD, a light emitting diode LED (light emitting element), and a control circuit 20. The control circuit 20 drives the light emitting diode LED, the photodiode PD for light reception (light receiving element) converts light into a current, and the control circuit 20 determines whether a detection target 21 is positioned proximately or not. In a case where the detection target 21 exists, the detection target 21 reflects light from the light emitting diode LED. Consequently, reflected light 22 is incident to the photodiode PD.

The following explains FIG. 1 which is a block diagram showing the sensor device 1. The sensor device 1 shown in FIG. 1 includes the photodiode PD, an ADC 2, (analog-to-digital conversion section), a comparison circuit 3 (comparison section), a storage circuit 4 (storage section), a current power circuit 5, a change-over switch SW0', and a switch control circuit 50 (switch control section). The current source circuit 5 includes a variable current source 6 and an open-close switch SW0.

In the sensor device 1 shown in FIG. 1, a power source voltage Vdd is applied to an input terminal of the variable current source 6. An output terminal of the variable current source 6 is connected with one end of the open-close switch SW0.

The other end of the open-close switch SW0 is connected with a cathode of the photodiode PD and an input terminal of the ADC 2. An output terminal of the ADC 2 is connected with one end of the change-over switch SW0' and an input terminal of the storage circuit 4. A current control signal Sc is outputted from an output terminal of the storage circuit 4 to a control input terminal of the variable current source 6.

The other end of the change-over switch SW0' is connected with one of two input terminals of the comparison circuit 3. A predetermined threshold Data_th is inputted to the other of the two input terminals of the comparison circuit 3. A digital output signal Dout is outputted from an output terminal of the comparison circuit 3 to the outside.

The switch control circuit 50 outputs, to the open-close switch SW0 and the change-over switch SW0', signals which correspond to the respective switches and which control operations of the respective switches.

An anode of the photodiode PD is electrically grounded.

The storage circuit 4 may be constituted by a resistor circuit, a memory circuit etc.

[Operation of Sensor Device 1 of Example 1]

FIGS. 2(a), 2(b), 3(a), and 3(b) are explanatory drawings showing operation waveforms of the sensor device 1 of Example 1 in accordance with the present embodiment. Initially, with reference to FIGS. 2(a) and 2(b), the following explains the operation of the sensor device 1 in a case where the sensor device 1 is not irradiated with outside ambient light such as sunlight.

FIG. 2(a) is a waveform chart showing a case where the sensor device 1 is not irradiated with outside ambient light such as sunlight and the detection target 21 exists in Example 1. FIG. 2(b) is a waveform chart showing a case where the sensor device 1 is not irradiated with outside ambient light such as sunlight and the detection target 21 does not exist in Example 1. A first case is explained with reference to FIG. 2(a). A second case is explained with reference to FIG. 2(b).

In FIGS. 2(a) and 2(b), t_conv represents a measurement period (data conversion time). The measurement period t_conv will be mentioned later in the item [Integrating-type analog-to-digital conversion circuit 8].

[First Case]

The following explains a first case where the sensor device 1 is not irradiated with outside ambient light such as sunlight and the detection target 21 exists as shown in FIG. 2(a).

In a first step, when measuring Data 0 during a period of not driving the light emitting diode LED, the open-close switch SW0 is opened in the sensor device 1 in FIG. 1. The sensor device 1 in FIG. 1 includes the change-over switch SW0' capable of switching between the output terminal of the ADC 2 and the one of the two input terminals of the comparison circuit 3.

The change-over switch SW0' is always conducted when the sensor device 1 is not irradiated with outside ambient light such as sunlight. A first terminal of the change-over switch SW0' is connected with the one of the two input terminals of the comparison circuit 3. The first terminal of the change-over switch SW0' and a second terminal of the change-over switch SW0' are connected with the output terminal of the ADC 2 and the input terminal of the storage circuit 4. The first terminal and the second terminal are connected with each other.

When the sensor device 1 is irradiated with outside ambient light such as sunlight, the change-over switch SW0' can be switched between a state where the change-over switch SW0' is conducted and a state where the first terminal is connected with the third terminal so as to make one of the two input terminals of the comparison circuit 3 grounded electrically. The switch control circuit 50 included in the sensor device 1 transmits, to the switch SW0, a signal (first control signal) for controlling opening-closing of the switch SW0, and transmits, to the switch SW0', a signal (second control signal) for switching of the switch SW0'.

In the sensor device 1 in which the open-close switch SW0 is open, a current Iin from the photodiode PD (output current from a photodiode) can be represented by equation (1).

$$Iin \approx 0 \quad (1)$$

The current Iin in the equation (1) is subjected to analog-to-digital conversion by the ADC 2, so that Data0 as the digital value ADCOUT is obtained.

When measuring Data0, the other end of the change-over switch SW0' is grounded electrically, so that the input at the one of the two input terminals of the comparison circuit 3 is made 0. Consequently, when measuring Data0, the input 0 at the one of the two input terminals of the comparison circuit 3 does not exceed the threshold Data_th (Data_th>0) inputted to the other of the two input terminals of the comparison circuit 3 (i.e. not more than the threshold Data_th). As a result, the digital output signal Dout in a Low level is outputted to the outside.

Data0 is stored in the storage circuit 4. The storage circuit 4 outputs, to the control input terminal of the variable current source 6, a current control signal Sc which is a signal corresponding to Data0. The variable current source 6 can output a current I1≈0 corresponding to Data0 (output current from variable current source) in response to the current control signal Sc.

Assume that in a second step following the first step, Data1 during a period of driving the light emitting diode LED is measured. At that time, the open-close switch SW0 is closed in the sensor device 1 in FIG. 1. Consequently, a current which is a difference between the current I1≈0 corresponding to Data0 and the current from the photodiode PD is obtained by subtraction represented by equation (2). The current thus obtained is inputted to the ADC 2 and is subjected to analog-to-digital conversion, so that Data1 as the digital value ADCOUT is obtained.

$$Iin - I1 = Iin\_data1 \quad (2)$$
$$= Iin\_ledon \ldots I1$$
$$\approx Iin\_ledon$$

the current Iin_ledon in equation (2) represents a current which the photodiode PD receives when the light emitting diode LED emits light (i.e. when Data1 is measured).

Data1 inputted to the one of the two input terminals of the comparison circuit 3 is set to be a value larger than the threshold Data_th inputted to the other of the two input terminals of the comparison circuit 3. Consequently, a pulse indicating that the detection target 21 is positioned proximately, which pulse is generated by the change of the digital output signal Dout from Low level to Hi level, is outputted as the digital output signal Dout to the outside.

[Second Case]

The following explains a second case where the sensor device 1 is not irradiated with outside ambient light such as sunlight and the detection target 21 does not exist as shown in FIG. 2(b).

When measuring Data0 in the first step, a current Iin≈0 in equation (1) is obtained similarly with the case of FIG. 2(a). Further, similarly with the case of FIG. 2(a), the variable current source 6 can output the current I1≈0 corresponding to Data0.

Assume that in a second step following the first step, Data1 during a period of driving the light emitting diode LED is measured. At that time, the open-close switch SW0 is closed in the sensor device 1 in FIG. 1. Consequently, a current represented by equation (2) is obtained. However, since the detection target 21 does not exist in the case of FIG. 2(b), the current Iin_ledon in equation (2) is equal to the current I1. As a result, a value obtained by subtracting the current I1 from the current Iin, i.e. 0, is inputted to the ADC 2.

$$Iin - I1 = Iin\_data1 \quad (3)$$
$$= Iin\_ledon - I1$$
$$= I1 - I1$$
$$= 0$$

As a result of analog-to-digital conversion by the ADC 2, Data1 as the digital value ADCOUT is represented by equation (4).

$$Data1 = 0 \quad (4)$$

Since Data1 is 0, Data1 does not exceed the threshold Data_th inputted to the other of the two input terminals of the comparison circuit 3, so that the digital output signal Dout is kept in a Low level. As a result, a Low level signal indicating that the detection target 21 is not positioned proximately is outputted as the digital output signal Dout to the outside.

FIG. 3(a) is a waveform chart showing a case where the sensor device 1 is irradiated with outside ambient light such as sunlight and the detection target 21 exists in Example 1. FIG. 3(b) is a waveform chart showing a case where the sensor device 1 is irradiated with outside ambient light such as sunlight and the detection target 21 does not exist in Example 1. A third case is explained with reference to FIG. 3(a). A fourth case is explained with reference to FIG. 3(b).

[Third Case]

The following explains a third case where the sensor device 1 is irradiated with outside ambient light such as sunlight and the detection target 21 exists as shown in FIG. 3(a).

In a first step, when measuring Data0 during a period of not driving the light emitting diode LED, the open-close switch SW0 is opened in the sensor device 1 shown in FIG. 1. In the sensor device 1 in which the open-close switch SW0 is open, a current Iin outputted from the photodiode PD is represented by equation (5).

$$Iin = Iin\_data0 = Iin\_sun \qquad (5)$$

Data corresponding to the current Iin_sun is indicated by a hatched part in FIG. 3(a). The current Iin_sun in equation (5), which indicates the result of measurement of outside ambient light such as sunlight, is subjected to analog-to-digital conversion by the ADC 2, so that Data0 as the digital value ADCOUT is obtained.

Data0 obtained from the current Iin in equation (5) is used only as the result of measurement of outside ambient light such as sunlight, and is not used for determining whether the detection target 21 is positioned proximately or not. For this purpose, the change-over switch SW0' is opened when measuring Data0. Consequently, Data0 is not inputted to the one of the two input terminals of the comparison circuit 3 but is inputted only to the storage circuit 4.

As described above, the change-over switch SW0' is opened, so that the input at the one of the two input terminals of the comparison circuit 3 does not exceed the threshold Data_th inputted to the other of the two input terminals of the comparison circuit 3. As a result, the digital output signal Dout in a Low level is outputted to the outside.

Data0 is stored in the storage circuit 4. The storage circuit 4 outputs, to the control input terminal of the variable current source 6, a current control signal Sc which is a signal corresponding to Data0. The variable current source 6 can output a current I1=Iin_sun corresponding to Data0 in response to the current control signal Sc.

Assume that in a second step following the first step, Data1 during a period of driving the light emitting diode LED is measured. At that time, the open-close switch SW0 is closed in the sensor device 1 in FIG. 1. Consequently, a current which is a difference between the current I1=Iin_sun corresponding to Data0 reflecting the result of measurement of outside ambient light such as sunlight and the current Iin from the photodiode PD is obtained by subtraction represented by equation (6). The current thus obtained is inputted to the ADC 2 and is subjected to analog-to-digital conversion, so that Data1 as the digital value ADCOUT is obtained.

$$Iin - I1 = Iin\_data1 \qquad (6)$$
$$= Iin\_ledon - I1$$
$$= Iin\_ledon - Iin\_sun$$

When measuring Data1, not only the open-close switch SW0 but also the change-over switch SW0' are closed. Consequently, Data1 inputted to the one of the two input terminals of the comparison circuit 3 exceeds the threshold Data_th inputted to the other of the two input terminals of the comparison circuit 3, but does not reach the full scale of the ADC 2. This is because subtraction has been made when calculating the current represented by equation (6).

Therefore, Data1 is data from which the influence of outside ambient light such as sunlight has been removed. Since Data1 exceeds the threshold Data_th, the digital output signal Dout changes from Low level to Hi level. Consequently, a pulse indicating that the detection target 21 is positioned proximately is generated, and is outputted as the digital output signal Dout to the outside.

As described above, the sensor device 1 of Example 1 does not make malfunction derived from the influence of outside ambient light having extremely high illuminance such as sunlight as seen in the conventional proximity sensor 113.

In a case where there is outside ambient light having extremely high illuminance such as sunlight, sensor devices 1 and 31 of later-mentioned Example 3 in accordance with the present embodiment are designed such that the full scale of the ADC 2 is changed according to data to be measured.

Consequently, the digital value ADCOUT in the ADC 2 does not get saturated. For example, in a case of the 16-bit ADC 2, the digital value ADCOUT does not reach 65535 counts which is the full scale. Accordingly, it is possible to prevent malfunction of the sensor device regardless of the presence of outside ambient light having extremely high illuminance such as sunlight. This will be detailed in [Example 3].

[Fourth Case]

The following explains a fourth case where the sensor device 1 is irradiated with outside ambient light such as sunlight and the detection target 21 does not exist as shown in FIG. 3(b).

When measuring Data0 in the first step, a current Iin=Iin_sun in equation (5) is obtained similarly with the case of FIG. 3(a). Further, similarly with the case of FIG. 3(a), the variable current source 6 can output the current I1=Iin_sun corresponding to Data0.

In a second step following the first step, when measuring Data1 during a period of driving the light emitting diode LED, the open-close switch SW0 and the change-over switch SW0' are closed in the sensor device 1 in FIG. 1. Consequently, a current represented by equation (6) is obtained. However, since the detection target 21 does not exist in the case of FIG. 3(b), the current Iin_ledon in equation (6) is equal to the current Iin_sun. As a result, a value represented by equation (7) is inputted to the ADC 2 and is subjected to analog-to-digital conversion.

$$Iin - I1 = Iin\_data1 \qquad (7)$$
$$= Iin\_ledon - I1$$
$$= Iin\_sun - Iin\_sun$$
$$= 0$$

As a result, Data1 obtained as the digital value ADCOUT is represented by equation (8).

$$Data1 = 0 \qquad (8)$$

Since Data1 is 0, Data1 does not exceed the threshold Data_th inputted to the other of the two input terminals of the comparison circuit 3, so that the digital output signal Dout is kept in a Low level. As a result, a Low level signal indicating that the detection target 21 is not positioned proximately is outputted as the digital output signal Dout to the outside.

Figure 18:
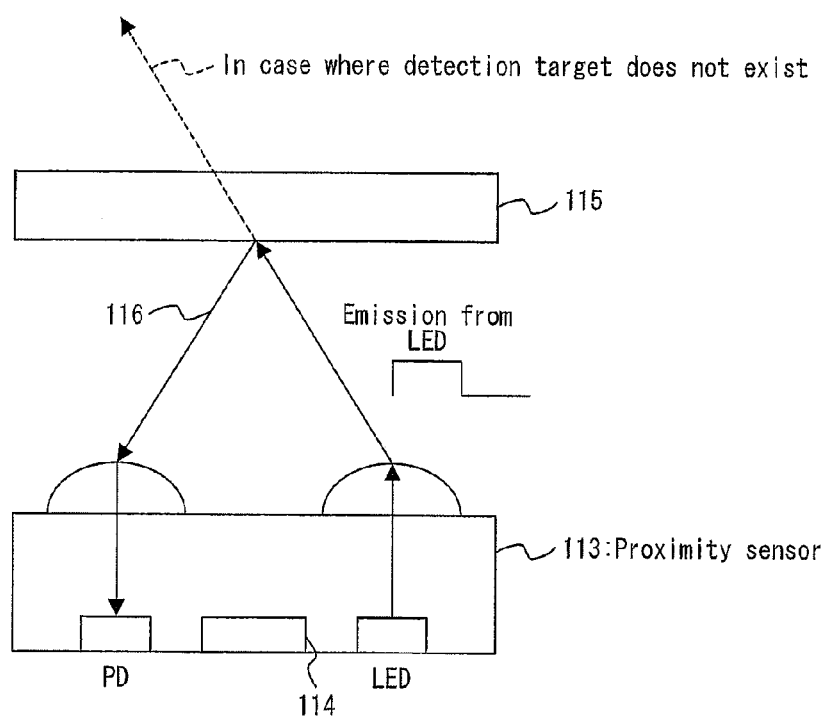
FIG. 18 is an elevation view showing a configuration of a general proximity sensor to which the teaching of Patent Literature 3 was applied.
Figure 20:
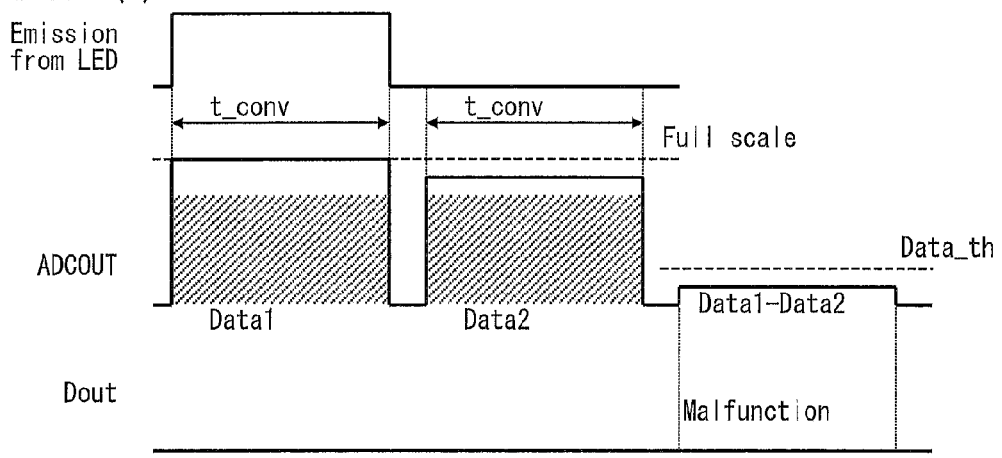
FIG. 20(a) is a waveform chart showing a case where a detection target is positioned proximately to the general proximity sensor in FIG. 18 irradiated with outside ambient light such as sunlight.
FIG. 20(b) is a waveform chart showing a case where a detection target is not positioned proximately to the general proximity sensor in FIG. 18 irradiated with outside ambient light such as sunlight.
Figure 20:
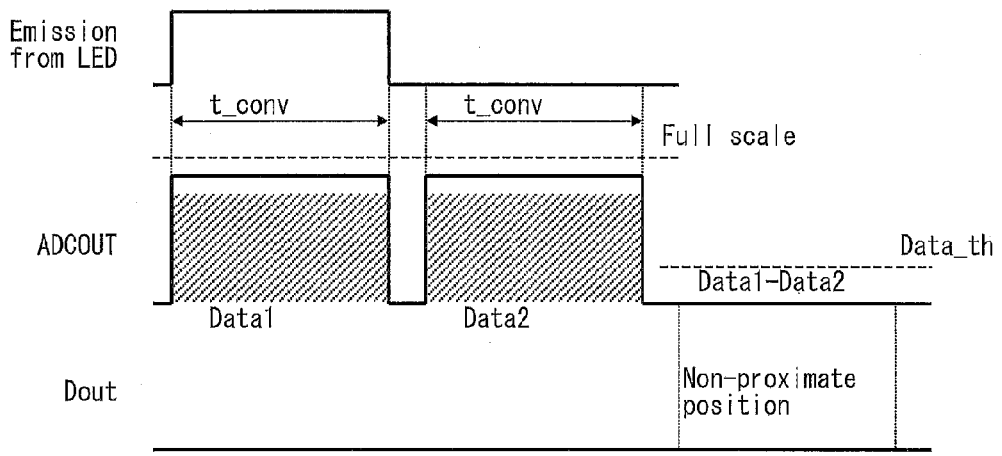

In a case where illuminance of sunlight is extremely high, as explained in the Technical Problem, even if measured data includes only addition (hatched part) derived from sunlight, the measured data reaches the full scale. Consequently, the conventional proximity sensor 113 shown in FIG. 18 suffers a malfunction in which the detection target 115 is wrongly determined as not existing.

(Sensor Devices 1 and 31 Serving as Range-Finding Sensors)

Figure 4:
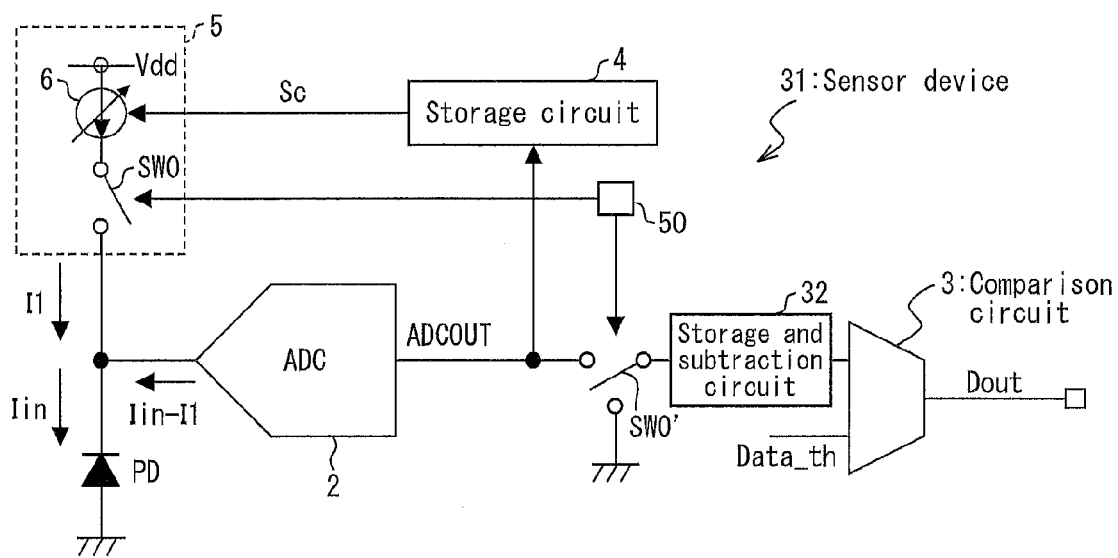
FIG. 4 is a block diagram showing a sensor device in accordance with Examples 2 and 3 of the present invention.

The sensor device 1 of Example 1 can serve as a proximity sensor for determining whether the detection target 21 is positioned proximately or not. A sensor device 31 shown in FIG. 4 is a sensor device of later-mentioned Examples 2 and 3.

An output of a proximity sensor is inversely proportional to square of a distance between the proximity sensor and a detection target. Accordingly, the sensor device 1 serving as a proximity sensor calculates a distance L [cm] based on the count number Ncount which is an output from the ADC 2 when the ADC 2 is an integrating-type analog-to-digital conversion circuit 8 (see FIG. 9). This enables the sensor device 1 serving as a proximity sensor to serve as a range-finding sensor. This is detailed below.

Initially, radiant intensity of the light emitting diode LED is set to $E[\mu W/sr]$, and reflectance of the detection target 21 is set to $\eta$. In this case, radiant illuminance Ee of the reflected light 22 from the detection target 21 positioned away by the distance L [cm] from the sensor device 1 is represented by equation (9).

$$Ee = E/\{(2 \times L)^2\} \times \eta \, [\mu W/cm^2] \quad (9)$$

sr in the unit of radiant intensity E represents steradian (solid angle). Light emitted from the light emitting diode LED is propagated by the distance L [cm] and the reflected light 22 resulting from reflection by the detection target 21 is propagated by the distance L [cm]. Consequently, equation (9) includes (2×L).

Next, the area of a light-receiving surface of the photodiode PD is set to S $[cm^2]$, and light-receiving sensibility of the photodiode PD is set to A $[nA/\mu W]$. In this case, current Iin outputted from the photodiode PD is represented by equation (10).

$$Iin = A \times Ee \times S \, [nA] \quad (10)$$

Further, the count number Ncount outputted from the analog-to-digital conversion circuit 8 is represented by equation (11).

$$Ncount = (Iin/Iref) \times 2^n \quad (11)$$

In equation (11), Iref represents a reference current and n represents resolution.

Accordingly, the count number Ncount is represented by equation (12) based on equations (9) to (11).

$$\begin{aligned} Ncount &= (A \times Ee \times S / Iref) \times 2^n \\ &= (A \times [E/\{(2 \times L)^2\} \times \eta] \times S / Iref) \times 2^n \\ &= \{A \times E \times \eta \times S \times 2^{(n-2)} / Iref\} / (L^2) \end{aligned} \quad (12)$$

Based on equation (12), the count number Ncount which is inversely proportional to $(L^2)$ which is the square of the distance is calculated. In this case, when proportionality constant in the inverse proportion is set to a1, equations (13) to (15) below are met.

$$Ncount \propto 1/(L^2) \quad (13)$$

$$Ncount = a1/(L^2) \quad (14)$$

$$a1 = A \times E \times \eta \times S \times 2^n / Iref \quad (15)$$

The above explanation on the range-finding sensor is directed to the sensor device 1 of Example 1. Similarly, the sensor device 31 of Examples 2 and 3, which is a proximity sensor, can serve as a range-finding sensor.

(Sensor Devices 1 and 31 Serving as Illuminance Sensors)

As described above, the sensor device 1 of Example 1 can serve as a proximity sensor which determines whether the detection target 21 is positioned proximately or not.

In the sensor device 1 capable of serving as a proximity sensor, the count number Ncount which is an output from the ADC 2 when the ADC 2 is an integrating-type analog-to-digital conversion circuit 8 is directly proportional to radiant illuminance Ee $[\mu W/cm^2]$ (illuminance) of the reflected light 22. Accordingly, by calculating radiant illuminance Ee $[\mu W/cm^2]$ based on the count number Ncount which is an output in the sensor device 1, it is possible for the sensor device 1 serving as a proximity sensor to serve as an illuminance sensor. This is detailed later.

Initially, radiant illuminance of the reflected light 22 is set to Ee $[\mu W/cm^2]$, the area of a light-receiving surface of the photodiode PD is set to S $[cm^2]$, and light-receiving sensibility of the photodiode PD is set to A $[nA/\mu W]$. In this case, a current Iin outputted from the photodiode PD is represented by equation (16).

$$Iin = A \times Ee \times S \, [nA] \quad (16)$$

Further, in a case where the ADC 2 is the later-mentioned integrating-type analog-to-digital conversion circuit 8, the count number Ncount outputted from the analog-to-digital conversion circuit 8 is represented by equation (17).

$$Ncount = (Iin/Iref) \times 2^n \quad (17)$$

In equation (17), Iref represents a reference current and n represents resolution.

Accordingly, the count number Ncount is represented by equation (18) based on equations (16) and (17).

$$\begin{aligned} Ncount &= (A \times Ee \times S / Iref) \times 2^n \\ &= (A \times S \times 2^n / Iref) \times Ee \end{aligned} \quad (18)$$

Based on equation (18), the count number Ncount which is directly proportional to radiant illuminance Ee is calculated. In this case, when proportionality constant in the proportion is set to a2, equations (19) to (21) below are met.

$$Ncount \propto Ee \quad (19)$$

$$Ncount = a2 \times Ee \quad (20)$$

$$a2 = A \times S \times 2^n / Iref \quad (21)$$

[Overview of Sensor Device 1 of Example 1]

The sensor device 1 of Example 1 can serve as a proximity sensor for determining whether the detection target 21 is positioned proximately or not. The sensor device 1 includes the light emitting diode LED, the ADC 2, the photodiode PD, the comparison circuit 3, the storage circuit 4, the change-over switch SW0', the open-close switch SW0, the variable current source 6, and the switch control circuit 50.

The light emitting diode LED emits, to a predetermined space, light to be reflected by the detection target 21 positioned proximately. The ADC 2 subjects an analog input current to analog-to-digital conversion. The photodiode PD is designed such that a cathode is connected with the input terminal of the ADC 2 and an anode is grounded electrically.

The comparison circuit 3 receives the digital value ADCOUT of the ADC 2 at one of two input terminals of the comparison circuit 3 and the predetermined threshold Data_th at the other of the two input terminals, and compares the digital value ADCOUT with the predetermined threshold Data_th. When the result of the comparison shows that the digital value ADCOUT is larger than the threshold Data_th, the comparison circuit 3 outputs a signal indicating that the detection target 21 is positioned proximately. When the result of the comparison shows that the digital value ADCOUT is not larger than the threshold Data_th, the comparison circuit 3 outputs a signal indicating that the detection target 21 is not positioned proximately. The storage circuit 4 stores the digital value ADCOUT.

The change-over switch SW0' is designed such that the first terminal is connected with the one of the two input terminals of the comparison circuit 3, the second terminal is connected with the output terminal of the ADC 2 and the input terminal of the storage circuit 4, and the third terminal is grounded electrically. The change-over switch SW0' connects the first terminal with the second terminal, or connects the first terminal with the third terminal so as to make the one of the two input terminals of the comparison circuit 3 grounded electrically.

The open-close switch SW0 is a switch whose one end is connected with the cathode of the photodiode PD and the input terminal of the ADC 2. The variable current source 6 is designed such that the power voltage Vdd is applied to the input terminal and the output terminal is connected with the other end of the open-close switch SW0.

The switch control circuit 50 outputs, to the control input terminal of the open-close switch SW0, the first control signal which is a control signal for controlling opening and closing of the open-close switch SW0. Further, the switch control circuit 50 outputs, to the control input terminal of the change-over switch SW0', the second control signal which is a control signal for controlling switching of the change-over switch SW0'.

With the above configuration, the light emitting diode LED is turned off, the open-close switch SW0 is opened, and the change-over switch SW0' connects the first terminal with the third terminal so that one of the two input terminals of the comparison circuit 3 is grounded electrically. This allows setting the current I1 from the variable power source 6.

After setting the current I1 from the variable current source 6, the light emitting diode LED is turned on. In this state, the open-close switch SW0 is closed, and the change-over switch SW0' connects (i) one of the two input terminals of the comparison circuit 3 which one terminal is connected with the first terminal with (ii) the output terminal of the ADC 2 which terminal is connected with the second terminal. This enables a current Iin−I1 which is a difference between the current I1 from the variable current source 6 and the current Iin from the photodiode PD when the light emitting diode LED is turned on to be inputted to the ADC 2.

The difference current Iin−I1 is a current from which the current I1 from the variable current source 6 was removed. The removed current I1 is equal to the current Iin from the light receiving element receiving the outside light when the light emitting element is turned off and the open-close switch is opened.

Consequently, determination of whether the detection target 21 is positioned proximately or not can be made accurately because the influence of the outside light is removed in the determination. Accordingly, it is possible to provide the sensor device 1 which does not make malfunction derived from outside ambient light such as sunlight.

The sensor device 1 determines whether the detection target 21 is positioned proximately or not as follows. In the first step, the light emitting diode LED is turned off, the open-close switch SW0 is open, and the change-over switch SW0' makes one of the two input terminals of the comparison circuit 3 grounded electrically. The ADC 2 subjects a current from the photodiode PD to analog-to-digital conversion and outputs the resulting digital value ADCOUT (Data0) to the storage circuit 4. The storage circuit 4 outputs a current control signal Sc to the control input terminal of the variable current source 6. The current control signal Sc indicates intensity of a current outputted from the photodiode PD in accordance with Data0. When receiving the current control signal Sc, the variable current source 6 sets the current I1 outputted therefrom to the current Iin outputted from the photodiode PD in accordance with Data0. In the second step following the first step, the light emitting diode LED is turned on, the open-close switch SW0 is closed, and the change-over switch SW0' connects the one of the two input terminals of the comparison circuit 3 with the output terminal of the ADC 2.

In the first step, Data0 is outputted to the storage circuit 4. This enables setting the current I1 from the variable current source 6. In the second step, the current Iin−I1 which is a difference between the current I1 from the variable current source 6 and the current Iin from the photodiode PD when the light emitting diode LED is turned on and the open-close switch SW0 is closed can be inputted to the ADC 2. The difference current Iin−I1 is a current from which the current I1 from the variable current source 6 was removed. The removed current I1 is equal to the current Iin from the photodiode PD receiving the outside light when the light emitting element LFD is turned off.

Consequently, determination of whether the detection target 21 is positioned proximately or not can be made accurately because the influence of the outside light is removed in the determination. Accordingly, it is possible to provide the sensor device 1 which does not make malfunction derived from outside ambient light such as sunlight.

Example 2

Figure 5:
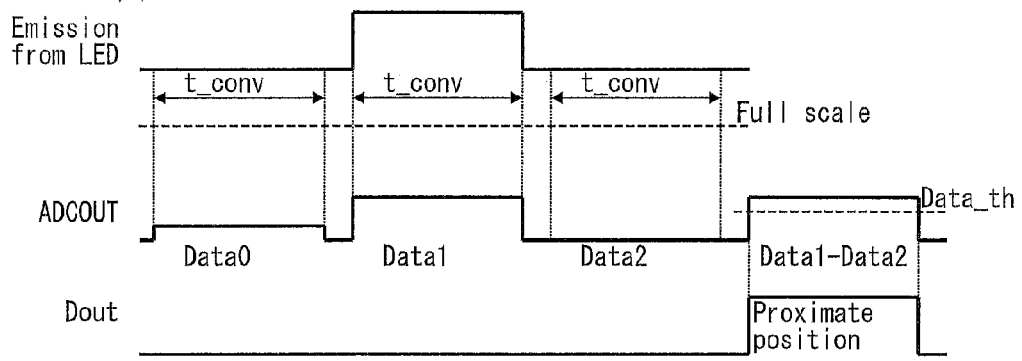
FIG. 5(*a*) is a waveform chart showing an operation waveform of the sensor device in accordance with Example 2 in a fifth case where the sensor device is not irradiated with outside ambient light such as sunlight and a detection target exists.
Figure 5:
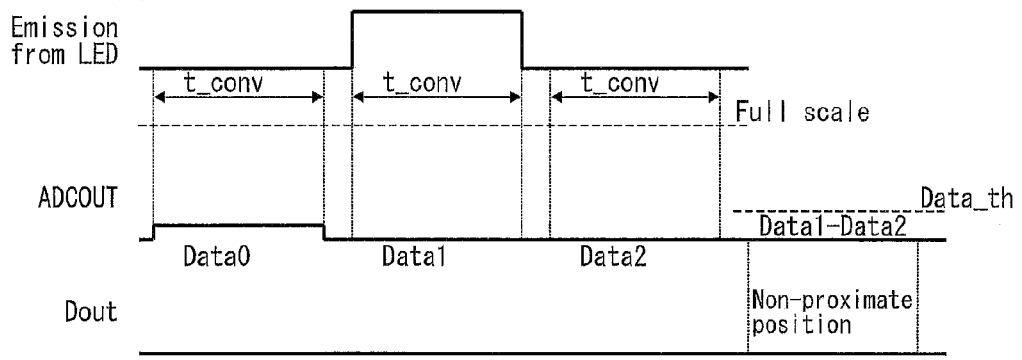
Figure 6:
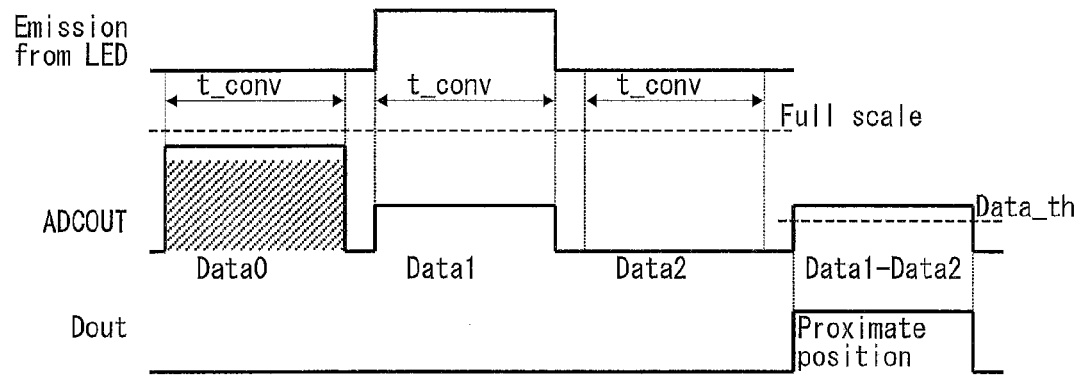
FIG. 6(*a*) is a waveform chart showing an operation waveform of the sensor device in accordance with Example 2 in a seventh case where the sensor device is irradiated with outside ambient light such as sunlight and a detection target exists.
Figure 6:
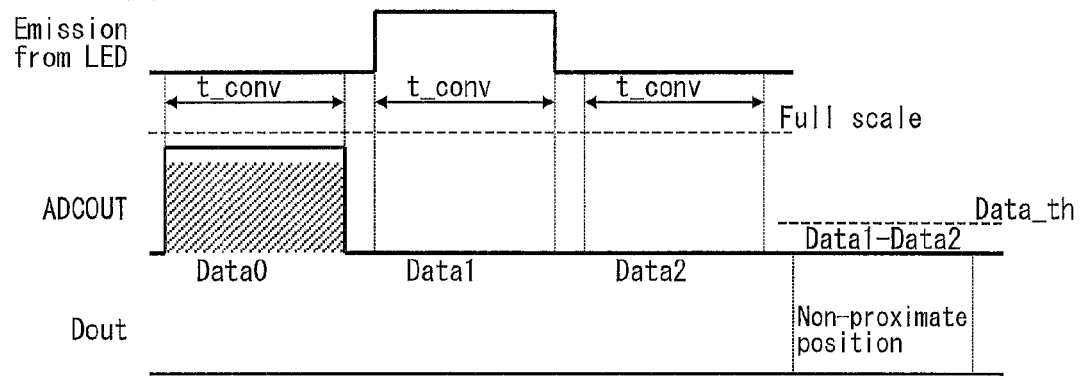
Figure 7:
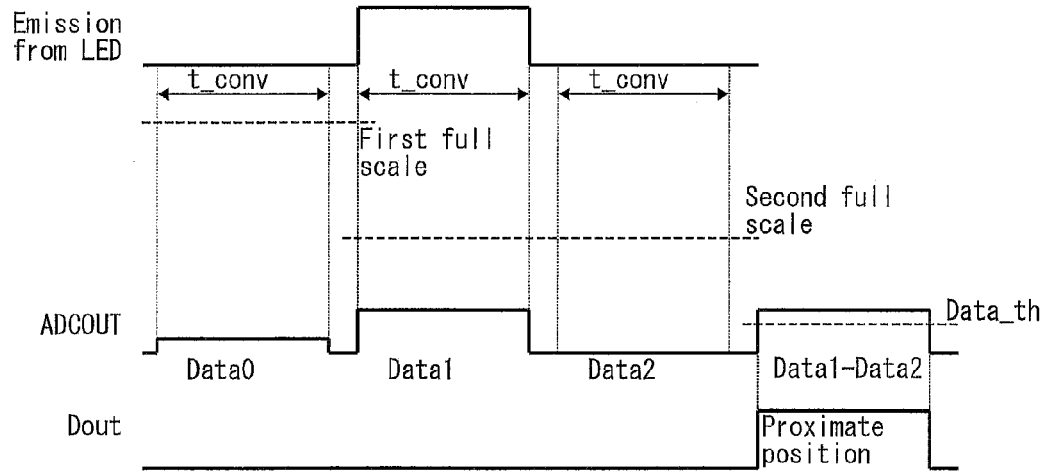
FIG. 7(*a*) is a waveform chart showing an operation waveform of the sensor device in accordance with Example 3 in a ninth case where the sensor device is not irradiated with outside ambient light such as sunlight and a detection target exists.
Figure 7:
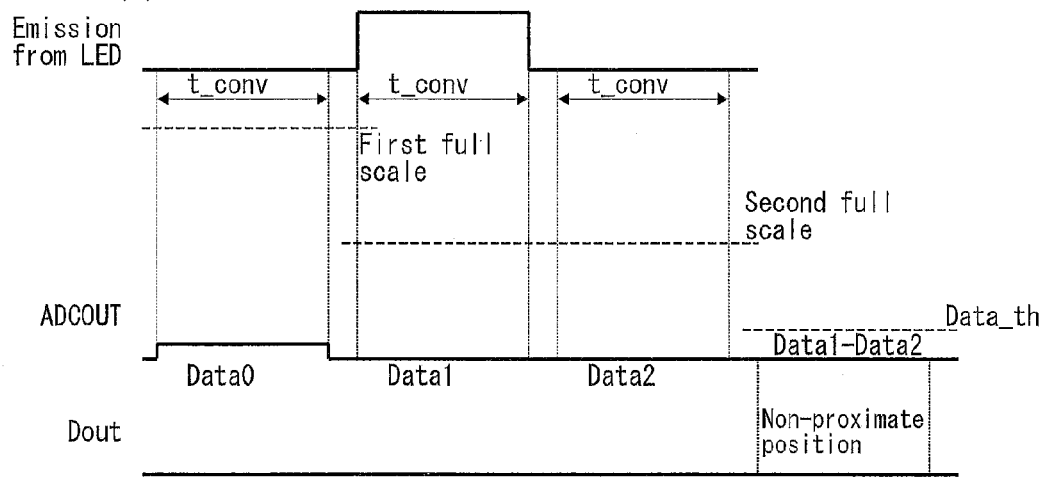

The following explains Example 2 of the present invention with reference to FIGS. 4-6.

Configurations of Example 2 which are not explained here are the same as those of Example 1. For convenience of explanation, members having the same functions as those shown in the drawings of Example 1 are given the same reference signs and explanations thereof are omitted here.

In Example 2, data during a period of measuring outside ambient light such as sunlight is referred to as Data0. Further, data during a period of driving a light emitting diode LED while a current I1 corresponding to Data0 (current corresponding to outside ambient light such as sunlight) is supplied to an ADC 2 is referred to as Data1. Further, data during a period of not driving the light emitting diode LED while the current I1 corresponding to Data0 is supplied to the ADC 2 is referred to as Data2 (third data).

(Sensor Device 31)

FIG. 4 is a block diagram showing the sensor device 31 in accordance with the present embodiment. The sensor device 31 is different from the sensor device 1 in the following two regards.

The first difference is as follows. The change-over switch SW0' of the sensor device 31 is switched as follows both in a case where the sensor device 31 is not irradiated with outside ambient light such as sunlight and in a case where the sensor device 31 is irradiated with outside ambient light such as sunlight. That is, when measuring Data0, the change-over switch SW0' makes the other end thereof grounded electrically. This makes an input terminal of a later-mentioned storage and subtraction circuit 32 (storage and subtraction section) grounded electrically. When measuring Data1 and Data2, the change-over switch SW0' is closed. This connects an output terminal of the ADC 2 with the input terminal of the storage and subtraction circuit 32. It should be noted that operation of the change-over SW0' is controlled in accordance with a signal from the switch control circuit 50 similarly with the case of the change-over switch SW0' of the sensor device 1.

The second difference is that the sensor device 31 includes the storage and subtraction circuit 32 between the other end of the change-over switch SW0' and one of two input terminals of the comparison circuit 3. The storage and subtraction circuit 32 will be detailed later with reference to FIGS. 5(a), 5(b), 6(a), and 6(b).

The sensor device 31 and the sensor device 1 share a common structure shown in the elevation view of FIG. 12. That is, the sensor device 31 includes a photodiode PD, a light emitting diode LED, and a control circuit 20.

(Operation of Sensor Device 31 of Example 2)

FIGS. 5(a), 5(b), 6(a), and 6(b) are explanatory drawings showing operation waveforms of the sensor device 31 of Example 2 in accordance with the present embodiment. Initially, the operation of the sensor device 31 when not irradiated with outside ambient light such as sunlight is explained below with reference to FIGS. 5(a) and 5(b).

FIG. 5(a) is a waveform chart showing operation waveform of the sensor device 31 in a case where the sensor device 31 is not irradiated with outside ambient light such as sunlight and the detection target 21 exists in Example 2. FIG. 5(b) is a waveform chart showing operation waveform of the sensor device 31 in a case where the sensor device 31 is not irradiated with outside ambient light such as sunlight and the detection target 21 does not exist in Example 2. A fifth case is explained with reference to FIG. 5(a) and a sixth case is explained with reference to FIG. 5(b).

(Fifth Case)

The fifth case is a case where the sensor device 31 is irradiated with outside ambient light such as sunlight and the detection target 21 exists as shown in FIG. 5(a).

In a first step, when measuring Data0 during a period of measuring outside ambient light such as sunlight, the open-close switch SW0 in the sensor device 31 in FIG. 4 is opened.

In the sensor device 31 in which the open-close switch SW0 is open, a current Iin outputted from the photodiode PD is represented by equation (22).

$$Iin \approx 0 \qquad (22)$$

A current Iin represented by equation (22) is subjected to analog-to-digital conversion by the ADC 2 so as to be Data0 which is a digital value ADCOUT.

When measuring Data0, the other end of the change-over switch SW0' is grounded electrically. This makes the input terminal of the storage and subtraction circuit 32 grounded electrically, so that an input at one of two input terminals of the comparison circuit 3 is 0. That is, when receiving the input 0, the storage and subtraction circuit 32 outputs 0 to one of two input terminals of the comparison circuit 3. Consequently, when measuring Data0, the input 0 at one of the two input terminals of the comparison circuit 3 does not exceed the threshold Data_th inputted to the other of the two input terminals of the comparison circuit 3, so that a digital output signal Dout in a Low level is outputted to the outside.

Data0 is stored in the storage circuit 4. The storage circuit 4 outputs, to the control input terminal of the variable current source 6, a current control signal Sc which is a signal corresponding to Data0. In response to the current control signal Sc, the variable current source 6 can output current I1≈0 corresponding to Data0.

Assume that in a second step following the first step, Data1 during a period of driving the light emitting diode LED while the current I1 corresponding to Data0 flows to the ADC 2 is measured. At that time, the open-close switch SW0 is closed in the sensor device 31 in FIG. 4. Consequently, a current which is a difference between the current I1≈0 corresponding to Data0 and the current Iin from the photodiode PD is obtained by subtraction represented by equation (23). The current thus obtained is inputted to the ADC 2 and is subjected to analog-to-digital conversion, so that Data1 as the digital value ADCOUT is obtained.

$$Iin - I1 = Iin\_data1 \qquad (23)$$
$$= Iin\_ledon - I1$$
$$\approx Iin\_ledon$$

When measuring Data1, the change-over switch SW0' connects one end thereof with the other end thereof so as to be conductive. This connects the output terminal of the ADC 2 with the input terminal of the storage and subtraction circuit 32, so that Data1 is inputted to the storage and subtraction circuit 32 and stored therein.

It should be noted that the storage and subtraction circuit 32 is designed such that after receiving Data1, the output of the storage and subtraction circuit 32 continues to be 0 which was obtained when measuring Data0. Consequently, the output of the storage and subtraction circuit 32 does not exceed the threshold Data_th inputted to the other of the two input terminals of the comparison circuit 3 when measuring Data1. As a result, the digital output signal Dout continues to be in a Low level.

Assume that in a third step following the second step, Data2 during a period of not driving the light emitting diode LED while the current I1 corresponding to Data0 flows to the ADC 2 is measured. At that time, the open-close switch SW0 is closed similarly with when Data1 was measured. Consequently, a current which is a difference between the current I1≈0 corresponding to Data0 and the current Iin from the photodiode PD is obtained by subtraction represented by equation (24). The current thus obtained is inputted to the ADC 2 and is subjected to analog-to-digital conversion, so that Data2 as the digital value ADCOUT is obtained.

$$Iin - I1 = Iin\_data2 \qquad (24)$$
$$= Iin\_ledoff - I1$$

Iin_ledoff in equation (24) represents a current into which light received by the photodiode PD is converted when the light emitting diode LED does not emit light (i.e. when Data2 is measured) while the current I1 corresponding to Data0 is supplied to the ADC 2. This current is represented by equation (25).

$$Iin\_ledoff \approx 0 \qquad (25)$$

Similarly with when measuring Data1, the change-over switch SW0' is conductive. Consequently, the output terminal of the ADC 2 is connected with the input terminal of the storage and subtraction circuit 32. As a result, Data2 is inputted to the storage and subtraction circuit 32 so that Data2 is subtracted from Data1 stored in the storage and subtraction circuit 32. Difference data Data1−Data2 which is the result of subtraction is inputted to the one of the two input terminals of the comparison circuit 3. Further, the current I1 from the variable current source 6 is set in such a manner that the currents meet equation (26) and Data1 corresponding to the current Iin_ledon exceeds the threshold Data_th inputted to the other of the two input terminals of the comparison circuit 3.

$$Iin\_ledon > Iin\_ledoff \tag{26}$$

Consequently, the difference data Data1−Data2 exceeds the threshold Data_th inputted to the other of the two input terminals of the comparison circuit 3. As a result, the digital output signal Dout changes from Low level to Hi level, which generates a pulse. The pulse indicates proximity of the detection target 21. The pulse is outputted as the digital output signal Dout to the outside.

The period for the difference data Data1−Data2 is a measurement period t_conv. This is because each of the period for Data1 and the period for Data2 is the measurement period t_conv.

Accordingly, the width of the pulse indicating proximity of the detection target 21 is equal to the measurement period t_conv. When the measurement period t_conv ends, the digital output signal Dout changes from Hi level to Low level, so that the pulse disappears.

The period for the difference data Data1−Data2 and the period for the pulse are also applied to cases below.

(Sixth Case)

The sixth case is a case where the sensor device 31 is not irradiated with outside ambient light such as sunlight and the detection target 21 does not exist as shown in FIG. 5(b).

In a first step, when measuring Data0, a current Iin≈0 represented by equation (22) is obtained similarly with the case of FIG. 5(a). Further, the variable current source 6 can output a current I1≈0 corresponding to Data0 similarly with the case of FIG. 5(a).

In a second step following the first step, when measuring Data1 during a period of driving the light emitting diode LED while the current I1 corresponding to Data0 flows to the ADC 2, the open-close switch SW0 is closed in the sensor device 31 in FIG. 4. Consequently, a current represented by equation (23) is obtained. Since the detection target 21 does not exist in the case shown in FIG. 5(b), a current Iin_ledon in equation (23) is equal to a current I1. As a result, a current represented by equation (27) is inputted to the ADC 2 and is subjected to analog-to-digital conversion.

$$Iin - I1 = Iin\_data1 \tag{27}$$
$$= Iin\_ledon - I1$$
$$= I1 - I1$$
$$= 0$$

As a result, Data1 obtained as the digital value ADCOUT is represented by equation (28).

$$Data1 = 0 \tag{28}$$

Since Data1 is 0, an input to the storage and subtraction circuit 32 is 0 similarly with when measuring Data0. Accordingly, an output from the storage and subtraction circuit 32 does not exceed the threshold Data_th inputted to the other of the two input terminals of the comparison circuit 3, when measuring Data1. Consequently, the digital output signal Dout continues to be in a Low level.

In a third step following the second step, when measuring Data2 during a period of not driving the light emitting diode LED while a current I1 corresponding to Data0 flows to the ADC 2, the open-close switch SW0 is closed in the sensor device 31 in FIG. 4. Consequently, a current represented by equation (24) is obtained. Since the detection target 21 does not exist in the case shown in FIG. 5(b), the current Iin_ledoff in equation (24) is equal to the current I1. As a result, a current represented by equation (29) is inputted to the ADC 2 and is subjected to analog-to-digital conversion.

$$Iin - I1 = Iin\_data2 \tag{29}$$
$$= Iin\_ledoff - I1$$
$$= I1 - I1$$
$$= 0$$

As a result, Data2 obtained as the digital value ADCOUT is represented by equation (30).

$$Data2 = 0 \tag{30}$$

Since Data2 is 0, an input to the storage and subtraction circuit 32 is 0 similarly with when measuring Data0 and Data1. Accordingly, an output from the storage and subtraction circuit 32 does not exceed the threshold Data_th inputted to the other of the two input terminals of the comparison circuit 3, when measuring Data2. Consequently, the digital output signal Dout continues to be in a Low level.

Since Data1 and Data2 are 0, difference data Data1−Data2 which is outputted from the storage and subtraction circuit 32 and is inputted to one of two input terminals of the comparison circuit 3 is also 0. The difference data Data1−Data2 which is inputted to the one of the two input terminals of the comparison circuit 3 and is 0 does not exceed the threshold Data_th inputted to the other of the two input terminals of the comparison circuit 3. As a result, the digital output signal Dout continues to be in a Low level.

FIG. 6(a) is a waveform chart showing operation waveform of the sensor device 31 in a case where the sensor device 31 is irradiated with outside ambient light such as sunlight and the detection target 21 exists in Example 2. FIG. 6(b) is a waveform chart showing operation waveform of the sensor device 31 in a case where the sensor device 31 is irradiated with outside ambient light such as sunlight and the detection target 21 does not exist in Example 2. A seventh case is explained with reference to FIG. 6(a) and an eighth case is explained with reference to FIG. 6(b).

(Seventh Case)

The seventh case is a case where the sensor device 31 is irradiated with outside ambient light such as sunlight and the detection target 21 exists as shown in FIG. 6(a).

In a first step, when measuring Data0 during a period of measuring outside ambient light such as sunlight, the open-close switch SW0 in the sensor device 31 in FIG. 4 is opened.

In the sensor device 31 in which the open-close switch SW0 is open, a current Iin outputted from the photodiode PD is represented by equation (31).

$$Iin = Iin\_sun \tag{31}$$

Data corresponding to a current Iin_sun is indicated by a hatched part in FIG. 6(a). The current Iin_sun in equation (31)

is a current indicating the result of measuring outside ambient light such as sunlight, and is subjected to analog-to-digital conversion by the ADC 2. As a result, Data0 as a digital value ADCOUT is obtained.

When measuring Data0, the other end of the change-over switch SW0' is grounded electrically. This makes the input terminal of the storage and subtraction circuit 32 grounded electrically, so that an input at one of two input terminals of the comparison circuit 3 is 0. That is, when receiving 0, the storage and subtraction circuit 32 outputs 0 to one of two input terminals of the comparison circuit 3. Consequently, when measuring Data0, the input 0 at one of the two input terminals of the comparison circuit 3 does not exceed the threshold Data_th inputted to the other of the two input terminals of the comparison circuit 3, so that a digital output signal Dout in a Low level is outputted to the outside.

Data0 is stored in the storage circuit 4. The storage circuit 4 outputs, to the control input terminal of the variable current source 6, a current control signal Sc corresponding to Data0. In response to the current control signal Sc, the variable current source 6 outputs current I1=Iin_sun corresponding to Data0.

Assume that in a second step following the first step, Data1 during a period of driving the light emitting diode LED while the current I1 corresponding to Data0 flows to the ADC 2 is measured. At that time, the open-close switch SW0 is closed in the sensor device 31 in FIG. 4. Consequently, a current which is a difference between the current I1=Iin_sun corresponding to Data0 and the current Iin from the photodiode PD is obtained by subtraction represented by equation (32). The current thus obtained is inputted to the ADC 2 and is subjected to analog-to-digital conversion, so that Data1 as the digital value ADCOUT is obtained.

$$Iin - I1 = Iin\_data1 \quad (32)$$

$$= Iin\_ledonIin\_sun$$

When measuring Data1, the change-over switch SW0' connects one end thereof with the other end thereof so as to be conductive. This connects the output terminal of the ADC 2 with the input terminal of the storage and subtraction circuit 32, so that Data1 is inputted to the storage and subtraction circuit 32 and stored therein.

It should be noted that the storage and subtraction circuit 32 is designed such that after receiving Data1, the output of the storage and subtraction circuit 32 continues to be 0 which was obtained when measuring Data0. Consequently, the output of the storage and subtraction circuit 32 does not exceed the threshold Data_th inputted to the other of the two input terminals of the comparison circuit 3 when measuring Data1. As a result, the digital output signal Dout continues to be in a Low level.

Assume that in a third step following the second step, Data2 during a period of not driving the light emitting diode LED while the current I1 corresponding to Data0 flows to the ADC 2 is measured. At that time, the open-close switch SW0 is closed similarly with when Data1 was measured. Consequently, a current which is a difference between the current I1=Iin_sun corresponding to Data0 and the current Iin from the photodiode PD is obtained by subtraction represented by equation (33). The current thus obtained is inputted to the ADC 2 and is subjected to analog-to-digital conversion, so that Data2 as the digital value ADCOUT is obtained.

$$Iin - I1 = Iin\_data2 \quad (33)$$

$$= Iin\_ledoffIin\_sun$$

Similarly with when measuring Data1, the change-over switch SW0' is conductive. Consequently, the output terminal of the ADC 2 is connected with the input terminal of the storage and subtraction circuit 32. As a result, Data2 is inputted to the storage and subtraction circuit 32 so that Data2 is subtracted from Data1 stored in the storage and subtraction circuit 32. Difference data Data1−Data2 which is the result of subtraction is inputted to the one of the two input terminals of the comparison circuit 3.

A case where the difference data Data1−Data2 is generated based on equations (32) and (33) corresponds to a case where a current represented by equation (34) below is inputted to the ADC 2.

$$Iin\_data2Iin\_data1$$

$$=(Iin\_ledonIin\_sun)-(Iin\_ledoffIin\_sun)$$

$$=Iin\_ledonIin\_ledoff \quad (34)$$

Equation (34) does not include a term of a current I1=Iin_sun corresponding to Data0 (current corresponding to outside ambient light such as sunlight). Accordingly, the difference data Data1−Data2 may be considered as data from which the influence of outside ambient light such as sunlight is removed.

Further, the current I1 from the variable current source 6 is set in such a manner that the currents meet equation (35), Iin_ledoff≈0 as shown in equation (25), and Data1 corresponding to the current Iin_ledon exceeds the threshold Data_th.

$$Iin\_ledon \gg Iin\_ledoff \quad (35)$$

Consequently, the difference data Data1−Data2 exceeds the threshold Data_th inputted to the other of the two input terminals of the comparison circuit 3. As a result, the digital output signal Dout changes from Low level to High level, which generates a pulse. The pulse indicates proximity of the detection target 21. The pulse is outputted as the digital output signal Dout to the outside.

(Eighth Case)

The eighth case is a case where the sensor device 31 is irradiated with outside ambient light such as sunlight and the detection target 21 does not exist as shown in FIG. 6(b).

In a first step, when measuring Data0, a current Iin=Iin_sun represented by equation (31) is obtained similarly with the case of FIG. 6(a). Further, the variable current source 6 can output a current I1=Iin_sun corresponding to Data0 similarly with the case of FIG. 6(a).

In a second step following the first step, assume that Data1 during a period of driving the light emitting diode LED while the current I1 corresponding to Data0 flows to the ADC 2 is measured. At that time, the open-close switch SW0 is closed in the sensor device 31 in FIG. 4. Consequently, a current represented by equation (32) is obtained. Since the detection target 21 does not exist in the case shown in FIG. 6(b), a current Iin_ledon in equation (32) is equal to the current Iin_sun. As a result, a current represented by equation (36) is inputted to the ADC 2 and is subjected to analog-to-digital conversion.

$$Iin - I1 = Iin\_data1 \quad (36)$$
$$= Iin\_ledon - I1$$
$$= Iin\_sun - Iin\_sun$$
$$= 0$$

As a result, Data1 obtained as the digital value ADCOUT is represented by equation (37).

$$Data1 = 0 \quad (37)$$

Since Data1 is 0, an input to the storage and subtraction circuit 32 is 0 similarly with when measuring Data0. Accordingly, an output from the storage and subtraction circuit 32 does not exceed the threshold Data_th inputted to the other of the two input terminals of the comparison circuit 3, when measuring Data1. Consequently, the digital output signal Dout continues to be in a Low level.

Assume that in a third step following the second step, when measuring Data2 during a period of not driving the light emitting diode LED while a current I1 corresponding to Data0 flows to the ADC 2. At that time, the open-close switch SW0 is closed in the sensor device 31 in FIG. 4. Consequently, a current represented by equation (33) is obtained. Since the detection target 21 does not exist in the case shown in FIG. 6(b), the current Iin_ledoff in equation (33) is equal to the current Iin_sun. As a result, a current represented by equation (38) is inputted to the ADC 2 and is subjected to analog-to-digital conversion.

$$Iin - I1 = Iin\_data2 \quad (38)$$
$$= Iin\_ledoff - I1$$
$$= Iin\_sun - Iin\_sun$$
$$= 0$$

As a result, Data2 obtained as the digital value ADCOUT is represented by equation (39).

$$Data2 = 0 \quad (39)$$

Since Data2 is 0, an input to the storage and subtraction circuit 32 is 0 similarly with when measuring Data0 and Data1. Accordingly, an output from the storage and subtraction circuit 32 does not exceed the threshold Data_th inputted to the other of the two input terminals of the comparison circuit 3, when measuring Data2. Consequently, the digital output signal Dout continues to be in a Low level.

Since Data1 and Data2 are 0, difference data Data1−Data2 which is outputted from the storage and subtraction circuit 32 and is inputted to one of two input terminals of the comparison circuit 3 is also 0. The difference data Data1−Data2 which is inputted to the one of the two input terminals of the comparison circuit 3 and is 0 does not exceed the threshold Data_th inputted to the other of the two input terminals of the comparison circuit 3. As a result, the digital output signal Dout continues to be in a Low level.

[Overview of Sensor Device 31 of Example 2]

The sensor device 31 of Example 2 can serve as a proximity sensor for determining whether the detection target 21 is positioned proximately or not. The sensor device 31 includes the light emitting diode LED, the ADC 2, the photodiode PD, the storage and subtraction circuit 32, the comparison circuit 3, the storage circuit 4, the change-over switch SW0', the open-close switch SW0, the variable current source 6, and the switch control circuit 50.

The light emitting diode LED emits, to a predetermined space, light to be reflected by the detection target 21 positioned proximately. The ADC 2 subjects an analog input current to analog-to-digital conversion. The photodiode PD is designed such that a cathode is connected with the input terminal of the ADC 2 and an anode is grounded electrically.

The storage and subtraction circuit 32 stores a firstly inputted digital value ADCOUT of the ADC 2, and upon second input of a digital value ADCOUT, outputs the firstly inputted digital value ADCOUT. Further, upon third input of a digital value ADCOUT, the storage and subtraction circuit 32 outputs a subtraction value obtained by subtracting the thirdly inputted digital value ADCOUT from the secondly inputted digital value ADCOUT.

The comparison circuit 3 receives the output of the storage and subtraction circuit 32 at one of two input terminals of the comparison circuit 3 and the predetermined threshold Data_th at the other of the two input terminals, and compares the digital value ADCOUT with the predetermined threshold Data_th. When the result of the comparison shows that the digital value ADCOUT is larger than the threshold Data_th, the comparison circuit 3 outputs a signal indicating that the detection target 21 is positioned proximately. When the result of the comparison shows that the digital value ADCOUT is not larger than the threshold Data_th, the comparison circuit 3 outputs a signal indicating that the detection target 21 is not positioned proximately. The storage circuit 4 stores the digital value ADCOUT.

The change-over switch SW0' is designed such that the first terminal is connected with the input terminal of the storage and subtraction circuit 32, the second terminal is connected with the output terminal of the ADC 2 and the input terminal of the storage circuit 4, and the third terminal is grounded electrically. The change-over switch SW0' connects the first terminal with the second terminal, or connects the first terminal with the third terminal so as to make the input terminal of the storage and subtraction circuit 32 grounded electrically.

The open-close switch SW0 is a switch whose one end is connected with the cathode of the photodiode PD and the input terminal of the ADC 2. The variable current source 6 is designed such that the power voltage Vdd is applied to the input terminal and the output terminal is connected with the other end of the open-close switch SW0.

The switch control circuit 50 outputs, to the control input terminal of the open-close switch SW0, the first control signal which is a control signal for controlling opening and closing of the open-close switch SW0. Further, the switch control circuit 50 outputs, to the control input terminal of the change-over switch SW0', the second control signal which is a control signal for controlling switching of the change-over switch SW0'.

With the configuration, the light emitting diode LED is turned off, the open-close switch SW0 is opened, and the change-over switch SW0' connects the first terminal with the third terminal so as to make the input terminal of the storage and subtraction circuit 32 grounded electrically. This enables setting the current I1 of the variable power source 6.

After setting the current I1 from the variable current source 6, the light emitting diode LED is turned on. In this state, the open-close switch SW0 is closed, and the change-over switch SW0' connects (i) the input terminal of the storage and subtraction circuit 32 which input terminal is connected with the first terminal with (ii) the output terminal of the ADC 2 which output terminal is connected with the second terminal. This enables the difference current Iin−I1 (first difference current) which is a difference between the current I1 from the variable current source 6 and the current Iin from the photodiode PD when the light emitting diode LED is turned on to be inputted to the ADC 2.

After the difference current Iin−I1 (first difference current) is inputted to the ADC 2, the light emitting diode LED is turned off. In this state, the open-close switch SW0 is closed, and the change-over switch SW0' connects (i) the input terminal of the storage and subtraction circuit 32 which input terminal is connected with the first terminal with (ii) the output terminal of the ADC 2 which output terminal is connected with the second terminal. This enables the difference current Iin−I1 (second difference current) which is a difference between the current I1 from the variable current source 6 and the current Iin from the photodiode PD when the light emitting diode LED is turned off to be inputted to the ADC 2.

The difference current Iin−I1 (first difference current, second difference current) is a current from which the current I1 from the variable current source 6 was removed. The removed current I1 from the variable current source 6 is equal to the current Iin from the photodiode PD receiving the outside light when the light emitting diode LED is turned off and the open-close switch SW0 is opened.

Consequently, determination of whether the detection target 21 is positioned proximately or not can be made accurately because the influence of the outside light is removed in the determination. Accordingly, it is possible to provide the sensor device 31 which does not make malfunction derived from outside ambient light such as sunlight.

The sensor device 31 determines whether the detection target 21 is positioned proximately or not as follows. In the first step, the light emitting diode LED is turned off, the open-close switch SW0 is opened, and the change-over switch SW0' makes the input terminal of the storage and subtraction circuit 32 grounded electrically. The ADC 2 subjects a current from the photodiode PD to analog-to-digital conversion and outputs the resulting digital value ADCOUT (Data0) to the storage circuit 4. The storage circuit 4 outputs a current control signal Sc to the control input terminal of the variable current source 6. The current control signal Sc indicates intensity of a current Iin outputted from the photodiode PD in accordance with Data0. When receiving the current control signal Sc, the variable current source 6 sets the current I1 outputted therefrom to the current Iin outputted from the photodiode PD in accordance with Data0.

In the second step following the first step, the light emitting diode LED is turned on, the open-close switch SW0 is closed, and the change-over switch SW0' connects the input terminal of the storage and subtraction circuit 32 with the output terminal of the ADC 2. In the third step following the second step, the light emitting diode LED is turned off and the open-close switch SW0 is closed.

In the first step, Data0 is outputted to the storage circuit 4. This enables setting the current I1 from the variable current source 6.

In the second step, the difference current Iin−I1 (first difference current) which is a difference between the current I1 from the variable current source 6 and the current Iin from the photodiode PD when the light emitting diode LED is turned on and the open-close switch SW0 is closed can be inputted to the ADC 2.

In the third step, the difference current Iin−I1 (second difference current) which is a difference between the current I1 from the variable current source 6 and the current Iin from the photodiode PD when the light emitting diode LED is turned off and the open-close switch SW0 is closed can be inputted to the ADC 2.

The difference current Iin−I1 (first difference current, second difference current) is a current from which the current I1 from the variable current source 6 was removed. The removed current I1 of the variable current source 6 is equal to the current Iin from the photodiode PD receiving the outside light when the light emitting diode LED is turned off.

Consequently, determination of whether the detection target 21 is positioned proximately or not can be made accurately because the influence of the outside light is removed in the determination. Accordingly, it is possible to provide the sensor device 31 which does not make malfunction derived from outside ambient light such as sunlight.

Example 3

The following explains Example 3 of the present invention with reference to FIGS. 4, 7(a), 7(b), 8(a), and 8(b). Configurations of Example 3 which are not explained here are the same as those of Examples 1 and 2. For convenience of explanation, members having the same functions as those shown in the drawings of Examples 1 and 2 are given the same reference signs and explanations thereof are omitted here.

In Example 3, an explanation will be made below as to a case where the sensor device 31 of Example 2 is irradiated with sunlight having so high illuminance that even if measured data includes only addition (hatched part) derived from sunlight, the measured data reaches the full scale (case where the phenomenon described in the Technical Problem occurs).

Definitions of Data0-Data2 in Example 3 are the same as those of Data0-Data2 in Example 2.

Similarly with Example 2, the sensor device 31 is used in Example 3. The sensor device 31 in Example 2 and the sensor device 31 in Example 3 are different from each other in the following regard. In the sensor device 31 in Example 2, the full scale of the ADC 2 is fixed as shown in FIGS. 5(a), 5(b), 6(a), and 6(b). In contrast thereto, in the sensor device 31 in Example 3, the full scale of the ADC 2 includes two full scales: a first full scale and a second full scale. The first full scale is a predetermined first upper limit being a wider limit range for the result of AD conversion when measuring Data0. The second full scale is a predetermined second upper limit being a narrower limit range for the result of AD conversion when measuring Data1 and Data2. The first upper limit is higher than the second upper limit.

Consequently, in Example 3, even if the sensor device 31 is irradiated with outside ambient light such as sunlight having so high illuminance that the hatched part in Data0 in Example 2 exceeds the full scale in Example 2, the sensor device 31 in Example 3 can obtain difference data Data1−Data2 from which the influence of sunlight was removed. Therefore, the sensor device 31 in Example 3 can accurately determine whether the detection target 21 is positioned proximately or not.

(Operation of Sensor Device 31 of Example 3)

FIGS. 7(a), 7(b), 8(a), and 8(b) are explanatory drawings showing operation waveforms of the sensor device 31 of Example 3 in accordance with the present embodiment. Initially, the operation of the sensor device 31 when not irradiated with outside ambient light such as sunlight is explained below with reference to FIGS. 7(a) and 7(b).

FIG. 7(a) is a waveform chart showing operation waveform of the sensor device 31 in a case where the sensor device 31 is not irradiated with outside ambient light such as sunlight and the detection target 21 exists in Example 3. FIG. 7(b) is a waveform chart showing operation waveform of the sensor device 31 in a case where the sensor device 31 is not irradiated with outside ambient light such as sunlight and the detection target 21 does not exist in Example 3. A ninth case is explained with reference to FIG. 7(a) and a tenth case is explained with reference to FIG. 7(b).

(Ninth Case)

The ninth case is a case where the sensor device 31 is not irradiated with outside ambient light such as sunlight and the detection target 21 exists as shown in FIG. 7(a).

In a first step, when measuring Data0 during a period of measuring outside ambient light such as sunlight, the open-close switch SW0 in the sensor device 31 in FIG. 4 is opened. The full scale of the ADC 2 for measuring Data0 is set to the first full scale.

In the sensor device 31 in which the open-close switch SW0 is open, a current Iin outputted from the photodiode PD is represented by equation (40).

$$Iin \approx 0 \quad (40)$$

A current Iin represented by equation (40) is subjected to analog-to-digital conversion by the ADC 2 so as to be Data0 which is a digital value ADCOUT.

When measuring Data0, the other end of the change-over switch SW0' is grounded electrically. This makes the input terminal of the storage and subtraction circuit 32 grounded electrically, so that an input at one of two input terminals of the comparison circuit 3 is 0. That is, when receiving 0, the storage and subtraction circuit 32 outputs 0 to one of two input terminals of the comparison circuit 3. Consequently, when measuring Data0, an input 0 at one of the two input terminals of the comparison circuit 3 does not exceed the threshold Data_th inputted to the other of the two input terminals of the comparison circuit 3, so that a digital output signal Dout in a Low level is outputted to the outside.

Data0 is stored in the storage circuit 4. The storage circuit 4 outputs, to the control input terminal of the variable current source 6, a current control signal Sc which is a signal corresponding to Data0. In response to the current control signal Sc, the variable current source 6 outputs current I1≈0 corresponding to Data0.

Assume that in a second step following the first step, Data1 during a period of driving the light emitting diode LED while the current I1 corresponding to Data0 flows to the ADC 2 is measured. At that time, the open-close switch SW0 is closed in the sensor device 31 in FIG. 4. Consequently, a current which is a difference between the current I1≈0 corresponding to Data0 and the current Iin from the photodiode PD is obtained by subtraction represented by equation (41). The current thus obtained is inputted to the ADC 2 and is subjected to analog-to-digital conversion, so that Data1 as the digital value ADCOUT is obtained.

$$Iin - I1 = Iin\_data1 \quad (41)$$
$$= Iin\_ledon - I1$$
$$\approx Iin\_ledon$$

When measuring Data1, the change-over switch SW0' connects one end thereof with the other end thereof so as to be conductive. This connects the output terminal of the ADC 2 with the input terminal of the storage and subtraction circuit 32, so that Data1 is inputted to the storage and subtraction circuit 32 and stored therein.

It should be noted that the storage and subtraction circuit 32 is designed such that after receiving Data1, the output of the storage and subtraction circuit 32 continues to be 0 which was obtained when measuring Data0. Consequently, the output of the storage and subtraction circuit 32 does not exceed the threshold Data_th inputted to the other of the two input terminals of the comparison circuit 3 when measuring Data1. As a result, the digital output signal Dout continues to be in a Low level.

Assume that in a third step following the second step, Data2 during a period of not driving the light emitting diode LED while the current I1 corresponding to Data0 flows to the ADC 2 is measured. At that time, the open-close switch SW0 is closed similarly with when Data1 was measured. Consequently, a current which is a difference between the current I1≈0 corresponding to Data0 and the current Iin from the photodiode PD is obtained by subtraction represented by equation (42). The current thus obtained is inputted to the ADC 2 and is subjected to analog-to-digital conversion, so that Data2 as the digital value ADCOUT is obtained.

$$Iin - I1 = Iin\_data2 \quad (42)$$
$$= Iin\_ledoff - I1$$

Similarly with when measuring Data1, the change-over switch SW0' is conductive. Consequently, the output terminal of the ADC 2 is connected with the input terminal of the storage and subtraction circuit 32. As a result, Data2 is inputted to the storage and subtraction circuit 32 so that Data2 is subtracted from Data1 stored in the storage and subtraction circuit 32. Difference data Data1−Data2 which is the result of subtraction is inputted to the one of the two input terminals of the comparison circuit 3. Further, the current I1 from the variable current source 6 is set in such a manner that the currents meet equation (43) and Data1 corresponding to the current Iin_ledon exceeds the threshold Data_th inputted to the other of the two input terminals of the comparison circuit 3.

$$Iin\_ledon \gg Iin\_ledoff \quad (43)$$

Consequently, the difference data Data1−Data2 exceeds the threshold Data_th inputted to the other of the two input terminals of the comparison circuit 3. As a result, the digital output signal Dout changes from Low level to Hi level, which generates a pulse. The pulse indicates proximity of the detection target 21. The pulse is outputted as the digital output signal Dout to the outside.

(Tenth Case)

The tenth case is a case where the sensor device 31 is not irradiated with outside ambient light such as sunlight and the detection target 21 does not exist as shown in FIG. 7(b).

In a first step, when measuring Data0, a current Iin≈0 represented by equation (40) is obtained similarly with the case of FIG. 7(a). Further, the variable current source 6 can output a current I1≈0 corresponding to Data0 similarly with the case of FIG. 7(a).

In a second step following the first step, when measuring Data1 during a period of driving the light emitting diode LED while the current I1 corresponding to Data0 flows to the ADC 2, the open-close switch SW0 is closed in the sensor device 31 in FIG. 4. Consequently, a current represented by equation (41) is obtained. Since the detection target 21 does not exist in the case shown in FIG. 7(b), a current Iin_ledon in equation

(41) is equal to a current I1. As a result, a current represented by equation (44) is inputted to the ADC 2 and is subjected to analog-to-digital conversion.

$$Iin - I1 = Iin\_data1 \quad (44)$$
$$= Iin\_ledon - I1$$
$$= I1 - I1$$
$$= 0$$

As a result, Data1 obtained as the digital value ADCOUT is represented by equation (45).

$$Data1 = 0 \quad (45)$$

Since Data1 is 0, an input to the storage and subtraction circuit 32 is 0 similarly with when measuring Data0. Accordingly, an output from the storage and subtraction circuit 32 does not exceed the threshold Data_th inputted to the other of the two input terminals of the comparison circuit 3, when measuring Data1. Consequently, the digital output signal Dout continues to be in a Low level.

In a third step following the second step, when measuring Data2 during a period of not driving the light emitting diode LED while a current I1 corresponding to Data0 flows to the ADC 2, the open-close switch SW0 is closed in the sensor device 31 in FIG. 4. Consequently, a current represented by equation (42) is obtained. Since the detection target 21 does not exist in the case shown in FIG. 7(b), the current Iin_ledoff in equation (42) is equal to the current I1. As a result, a current represented by equation (46) is inputted to the ADC 2 and is subjected to analog-to-digital conversion.

$$Iin - I1 = Iin\_data2 \quad (46)$$
$$= Iin\_ledoff - I1$$
$$= I1 - 11$$
$$= 0$$

As a result, Data2 obtained as the digital value ADCOUT is represented by equation (47).

$$Data2 = 0 \quad (47)$$

Since Data2 is 0, an input to the storage and subtraction circuit 32 is 0 similarly with when measuring Data0 and Data1. Accordingly, an output from the storage and subtraction circuit 32 does not exceed the threshold Data_th inputted to the other of the two input terminals of the comparison circuit 3, when measuring Data2. Consequently, the digital output signal Dout continues to be in a Low level.

Since Data1 and Data2 are 0, difference data Data1–Data2 which is outputted from the storage and subtraction circuit 32 and is inputted to one of two input terminals of the comparison circuit 3 is also 0. The difference data Data1–Data2 which is inputted to the one of the two input terminals of the comparison circuit 3 and is 0 does not exceed the threshold Data_th inputted to the other of the two input terminals of the comparison circuit 3. As a result, the digital output signal Dout continues to be in a Low level.

FIG. 8(a) is a waveform chart showing operation waveform of the sensor device 31 in a case where the sensor device 31 is irradiated with outside ambient light such as sunlight and the detection target 21 exists. FIG. 8(b) is a waveform chart showing operation waveform of the sensor device 31 in a case where the sensor device 31 is irradiated with outside ambient light such as sunlight and the detection target 21 does not exist. An eleventh case is explained with reference to FIG. 8(a) and a twelfth case is explained with reference to FIG. 8(b).

(Eleventh Case)

The eleventh case is a case where the sensor device 31 is irradiated with outside ambient light with extremely high illuminance such as sunlight and the detection target 21 exists as shown in FIG. 8(a).

In a first step, when measuring Data0 during a period of measuring outside ambient light such as sunlight, the open-close switch SW0 in the sensor device 31 in FIG. 4 is opened. The full scale of the ADC 2 for measuring Data0 is set to the first full scale.

In the sensor device 31 in which the open-close switch SW0 is open, a current Iin outputted from the photodiode PD is represented by equation (48).

$$Iin = Iin\_sun' \quad (48)$$

Data corresponding to the current Iin_sun' is data which is indicated by a hatched part in FIG. 8(a) and which exceeds the second full scale. The current Iin_sun' in equation (48), which is a current indicative of the result of measuring outside ambient light with extremely high illuminance such as sunlight, is subjected to analog-to-digital conversion by the ADC 2 so that Data0 as the digital value ADCOUT is obtained.

When measuring Data0, the other end of the change-over switch SW0' is grounded electrically. This makes the input terminal of the storage and subtraction circuit 32 grounded electrically, so that an input at one of two input terminals of the comparison circuit 3 is 0. That is, when receiving 0, the storage and subtraction circuit 32 outputs 0 to one of two input terminals of the comparison circuit 3. Consequently, when measuring Data0, an input 0 at one of the two input terminals of the comparison circuit 3 does not exceed the threshold Data_th inputted to the other of the two input terminals of the comparison circuit 3, so that a digital output signal Dout in a Low level is outputted to the outside.

Data0 is stored in the storage circuit 4. The storage circuit 4 outputs, to the control input terminal of the variable current source 6, a current control signal Sc corresponding to Data0. In response to the current control signal Sc, the variable current source 6 outputs current I1=Iin_sun' corresponding to Data0.

Assume that in a second step following the first step, Data1 during a period of driving the light emitting diode LED while the current I1 corresponding to Data0 flows to the ADC 2 is measured. At that time, the open-close switch SW0 is closed in the sensor device 31 in FIG. 4, and the full scale for the ADC 2 is set to the second full scale. Consequently, a current which is a difference between the current I1=Iin_sun' corresponding to Data0 and the current Iin from the photodiode PD is obtained by subtraction represented by equation (49). The current thus obtained is inputted to the ADC 2 and is subjected to analog-to-digital conversion, so that Data1 as the digital value ADCOUT is obtained.

$$Iin - I1 = Iin\_data1 \quad (49)$$
$$= Iin\_ledon - Iin\_sun'$$

When measuring Data1, the change-over switch SW0' connects one end thereof with the other end thereof so as to be conductive. This connects the output terminal of the ADC 2 with the input terminal of the storage and subtraction circuit 32, so that Data1 is inputted to the storage and subtraction circuit 32 and stored therein.

It should be noted that the storage and subtraction circuit 32 is designed such that after receiving Data1, the output of the storage and subtraction circuit 32 continues to be 0 which was obtained when measuring Data0. Consequently, the output of the storage and subtraction circuit 32 does not exceed the threshold Data_th inputted to the other of the two input terminals of the comparison circuit 3 when measuring Data1. As a result, the digital output signal Dout continues to be in a Low level.

Assume that in a third step following the second step, Data2 during a period of not driving the light emitting diode LED while the current I1 corresponding to Data0 flows to the ADC 2 is measured. At that time, the open-close switch SW0 is closed similarly with when Data1 was measured. Consequently, a current which is a difference between the current I1=Iin_sun' corresponding to Data0 and the current Iin from the photodiode PD is obtained by subtraction represented by equation (50). The current thus obtained is inputted to the ADC 2 and is subjected to analog-to-digital conversion, so that Data2 as the digital value ADCOUT is obtained.

$$Iin - I1 = Iin\_data2 \qquad (50)$$
$$= Iin\_ledoff - Iin\_sun'$$

Similarly with when measuring Data1, the change-over switch SW0' is conductive. Consequently, the output terminal of the ADC 2 is connected with the input terminal of the storage and subtraction circuit 32. As a result, Data2 is inputted to the storage and subtraction circuit 32 so that Data2 is subtracted from Data1 stored in the storage and subtraction circuit 32. Difference data Data1−Data2 which is the result of subtraction is inputted to the one of the two input terminals of the comparison circuit 3.

A case where the difference data Data1−Data2 is generated based on equations (49) and (50) corresponds to a case where a current represented by equation (51) below is inputted to the ADC 2.

$$Iin\_data2 - Iin\_data1$$
$$=(Iin\_ledon-Iin\_sun')-Iin\_ledoff-Iin\_sun')$$
$$=Iin\_ledon-Iin\_ledoff \qquad (51)$$

Equation (51) does not include a term of a current I1=Iin_sun' corresponding to Data0 (current corresponding to outside ambient light with extremely high illuminance such as sunlight). Accordingly, the difference data Data1−Data2 may be considered as data from which the influence of outside ambient light with extremely high illuminance such as sunlight is removed.

Further, the current I1 from the variable current source 6 is set in such a manner that the currents meet equation (52), Iin_ledoff≈0 as shown in equation (25), and Data1 corresponding to the current Iin_ledon exceeds the threshold Data_th.

$$Iin\_ledon \gg Iin\_ledoff \qquad (52)$$

Consequently, the difference data Data1−Data2 exceeds the threshold Data_th inputted to the other of the two input terminals of the comparison circuit 3. As a result, the digital output signal Dout changes from Low level to High level, which generates a pulse. The pulse indicates proximity of the detection target 21. The pulse is outputted as the digital output signal Dout to the outside.

(Twelfth Case)

Figure 8:
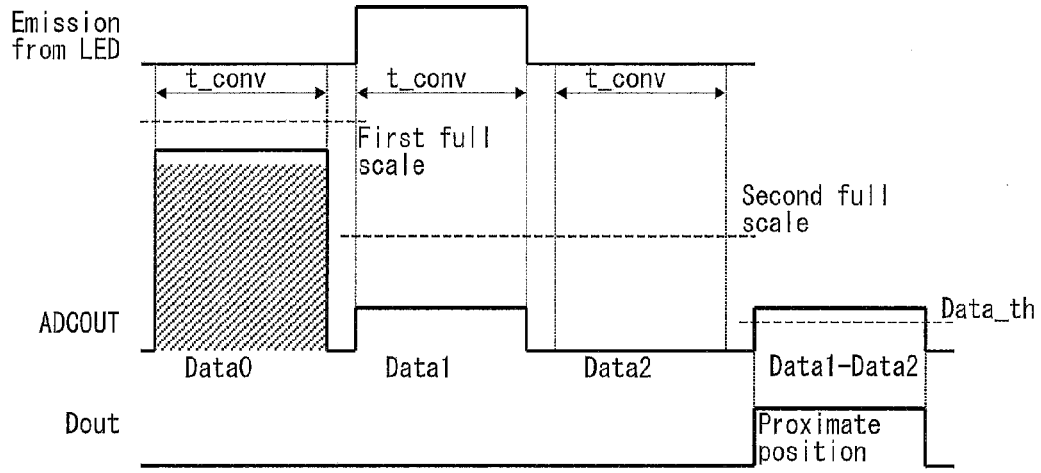
FIG. 8(*a*) is a waveform chart showing an operation waveform of the sensor device in accordance with Example 3 in an eleventh case where the sensor device is irradiated with outside ambient light with extremely high illuminance such as sunlight and a detection target exists.
Figure 8:
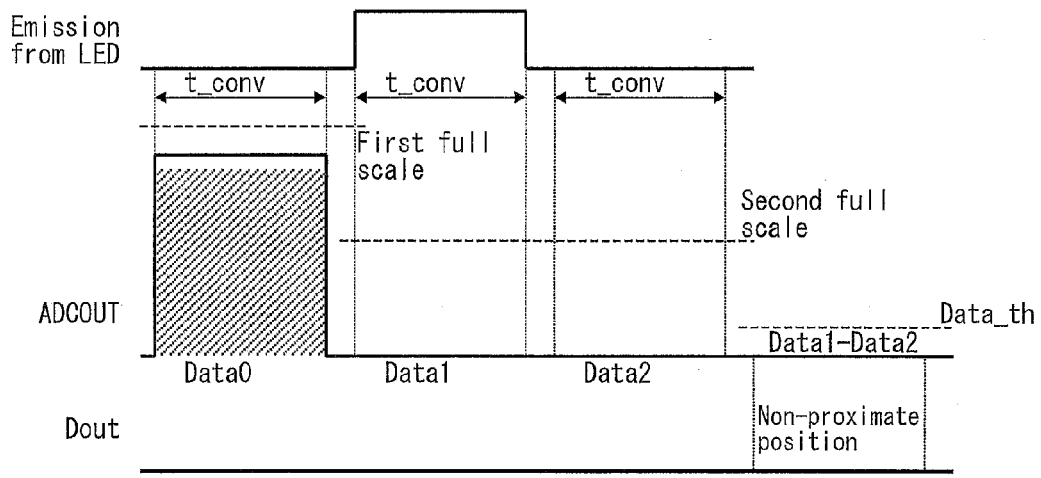

The twelfth case is a case where the sensor device 31 is irradiated with outside ambient light with extremely high illuminance such as sunlight and the detection target 21 does not exist as shown in FIG. 8(*b*).

In a first step, when measuring Data0, a current Iin=Iin_sun' represented by equation (48) is obtained similarly with the case of FIG. 8(*a*). Further, the variable current source 6 can output a current I1=Iin_sun' corresponding to Data0 similarly with the case of FIG. 8(*a*).

Assume that in a second step following the first step, Data1 during a period of driving the light emitting diode LED while the current I1 corresponding to Data0 flows to the ADC 2 is measured. At that time, the open-close switch SW0 is closed in the sensor device 31 in FIG. 4. Consequently, a current represented by equation (49) is obtained. Since the detection target 21 does not exist in the case shown in FIG. 8(*b*), a current Iin_ledon in equation (49) is equal to a current Iin_sun'. As a result, a current represented by equation (53) is inputted to the ADC 2 and is subjected to analog-to-digital conversion.

$$Iin - I1 = Iin\_data1 \qquad (53)$$
$$= Iin\_ledon - I1$$
$$= Iin\_sun' - Iin\_sun'$$
$$= 0$$

As a result, Data1 obtained as the digital value ADCOUT is represented by equation (54).

$$Data1=0 \qquad (54)$$

Since Data1 is 0, an input to the storage and subtraction circuit 32 is 0 similarly with when measuring Data0. Accordingly, an output from the storage and subtraction circuit 32 does not exceed the threshold Data_th inputted to the other of the two input terminals of the comparison circuit 3, when measuring Data1. Consequently, the digital output signal Dout continues to be in a Low level.

Assume that in a third step following the second step, Data2 during a period of not driving the light emitting diode LED while a current I1 corresponding to Data0 flows to the ADC 2 is measured. At that time, the open-close switch SW0 is closed in the sensor device 31 in FIG. 4. Consequently, a current represented by equation (50) is obtained. Since the detection target 21 does not exist in the case shown in FIG. 8(*b*), the current Iin_ledoff in equation (50) is equal to the current Iin_sun'. As a result, a current represented by equation (55) is inputted to the ADC 2 and is subjected to analog-to-digital conversion.

$$Iin - I1 = Iin\_data2 \qquad (55)$$
$$= Iin\_ledoff - I1$$
$$= Iin\_sun' - Iin\_sun'$$
$$= 0$$

As a result, Data2 obtained as the digital value ADCOUT is represented by equation (56).

$$Data2 = 0 \tag{56}$$

Since Data2 is 0, an input to the storage and subtraction circuit 32 is 0 similarly with when measuring Data0 and Data1. Accordingly, an output from the storage and subtraction circuit 32 does not exceed the threshold Data_th inputted to the other of the two input terminals of the comparison circuit 3, when measuring Data2. Consequently, the digital output signal Dout continues to be in a Low level.

Since Data1 and Data2 are 0, difference data Data1−Data2 which is outputted from the storage and subtraction circuit 32 and is inputted to one of two input terminals of the comparison circuit 3 is also 0. The difference data Data1−Data2 which is inputted to the one of the two input terminals of the comparison circuit 3 and is 0 does not exceed the threshold Data_th inputted to the other of the two input terminals of the comparison circuit 3. As a result, the digital output signal Dout continues to be in a Low level.

As described above, in Example 3, when measuring Data0, the full scale for the ADC 2 is set to the first full scale. Accordingly, when measuring Data0, even if the sensor device 31 is irradiated with outside ambient light with so high illuminance that Data0 exceeds the second full scale (e.g. sunlight), Data0 does not reach the first full scale and the digital value ADCOUT of the ADC 2 does not get saturated.

Further, the current corresponding to Data0 has been subtracted from the current to be inputted to the ADC 2 when measuring Data1 and Data2.

Consequently, the current corresponding to the difference data Data1−Data2 which is the difference between Data1 and Data2 does not contain the current corresponding to outside ambient light with extremely high illuminance such as sunlight. Accordingly, the digital value ADCOUT of the ADC 2 does not get saturated (in a case of the 16-bit ADC 2, the digital value ADCOUT does not reach 65535 counts which is the full scale). Accordingly, it is possible to prevent malfunction of the sensor device 31 by removing the influence of outside ambient light having extremely high illuminance such as sunlight.

In Example 3, the Ninth to Twelfth cases were explained using the sensor device 31 as an example similarly with Example 2.

Alternatively, Example 3 may use the sensor device 1 in Example 1. In this case, the sensor device 1 is arranged such that when measuring Data0, the full scale for the ADC 2 is set to a first full scale which is a broader full scale, and when measuring Data1, the full scale for the ADC 2 is set to a second full scale which is a narrower full scale.

Accordingly, when measuring Data0, even if the sensor device 1 is irradiated with outside ambient light with extremely high illuminance such as sunlight which would lead to Data0 exceeding the second full scale, Data0 does not reach the first full scale and the digital value ADCOUT of the ADC 2 does not get saturated.

Further, the current corresponding to Data0 has been subtracted from the current inputted to the ADC 2 when measuring Data1.

Consequently, the current corresponding to Data1 does not contain the current corresponding to outside ambient light with extremely high illuminance such as sunlight. Accordingly, it is possible to prevent malfunction of the sensor device 1 by removing the influence of outside ambient light having extremely high illuminance such as sunlight.

As described above, it is obvious that similarly with the sensor device 31 of Example 3, the sensor device 1 of Example 1 can be arranged in such a manner as not to make malfunction even if the sensor device 1 is irradiated with outside ambient light with extremely high illuminance such as sunlight.

Resolution n is finer when the full scale for the ADC 2 in the Examples is set to the second full scale than when the full scale for the ADC 2 is set to the first full scale.

[Integrating-Type Analog-to-Digital Conversion Circuit 8]

Figure 9:
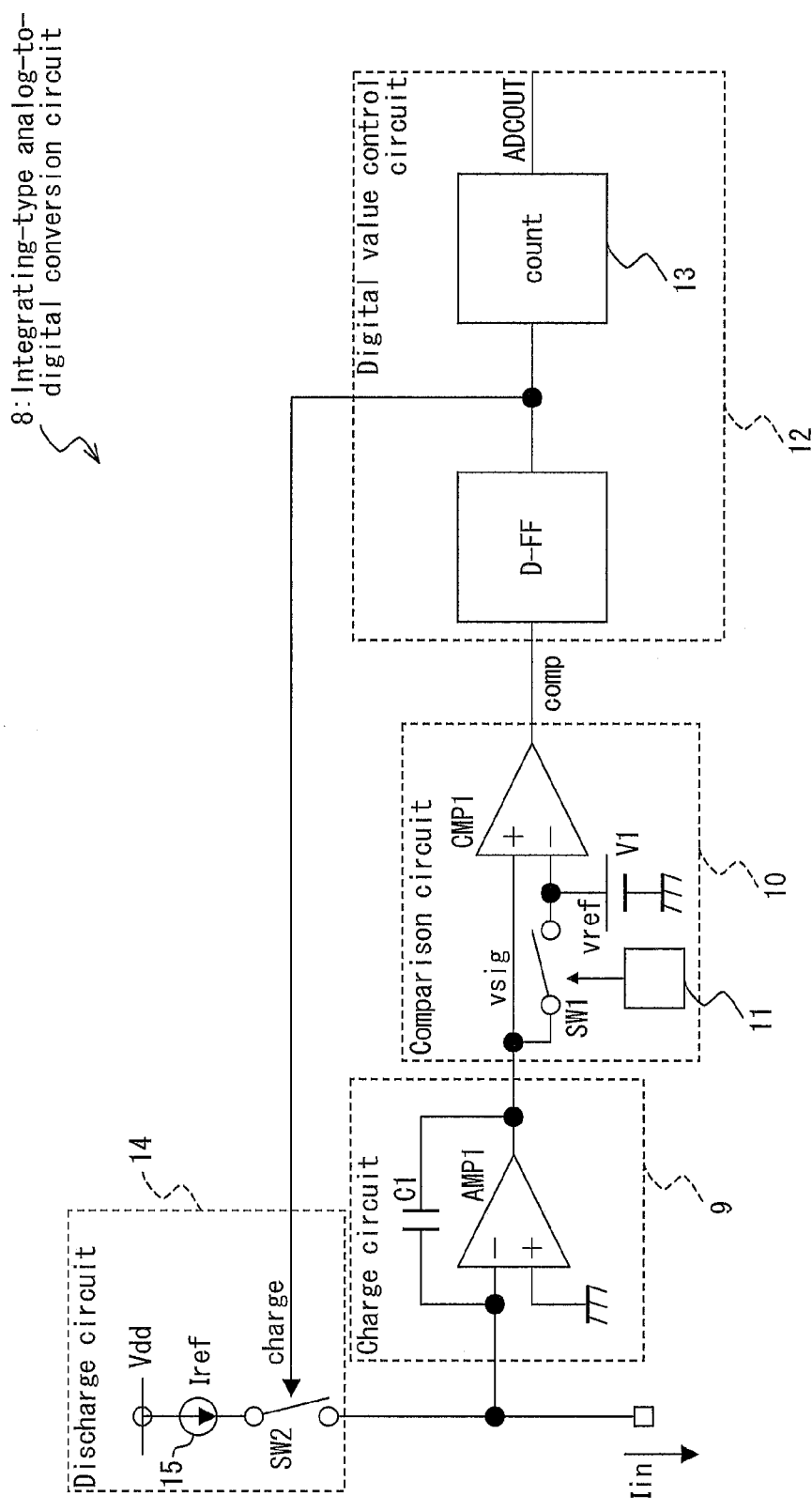
FIG. 9 is a block diagram showing an integrating-type analog-to-digital conversion circuit applied to the sensor device in FIG. 1.

The integrating-type analog-to-digital conversion circuit 8 shown in FIG. 9 is applied to the ADC 2 shown in FIG. 1. This application enables analog-to-digital conversion with a wide dynamic range and high resolution derived from the integrating-type analog-to-digital conversion circuit 8.

The integrating-type analog-to-digital conversion circuit 8 subjects an analog input current to digital conversion. The integrating-type analog-to-digital conversion circuit 8 includes a charge circuit 9 (charge section), a comparison circuit 10 (output voltage comparison section), a digital value control circuit 12, and a discharge circuit 14 (discharge section).

The charge circuit 9 includes a capacitor C1 and a differential amplifier AMP1. The capacitor C1 stores charges corresponding to a current Iin which is the analog input current. The differential amplifier AMP1 is designed such that an inverting input terminal (−) connected with one end of the capacitor C1 receives the current Iin, a non-inverting input terminal (+) is grounded electrically, and an output terminal connected with the other end of the capacitor C1 outputs an output voltage.

The comparison circuit 10 compares an output voltage vsig of the differential amplifier AMP1 of the charge circuit 9 with a reference voltage vref so as to output a comparison signal comp. The comparison circuit 10 includes a voltage source V1 for outputting the reference voltage vref and an open-close switch SW1 for opening and closing between an output end of the voltage source V1 and an output end of the charge circuit 9. Further, the comparison circuit 10 includes a switch control circuit 11 for outputting, to the open-close switch SW1, a switch control signal for controlling opening and closing of the open-close switch SW1.

The digital value control circuit 12 outputs a digital value corresponding to the number of discharges in accordance with the comparison signal comp from the comparison circuit 10.

The discharge circuit 14 discharges the charges stored in the capacitor C1.

When the integrating-type analog-to-digital conversion circuit 8 starts to operate, the open-close switch SW1 is closed in response to the switch control signal from the switch control circuit 11. Consequently, the output voltage vsig from the charge circuit 9 which is an integration circuit is equal to the reference voltage vref. During a measurement period (data conversion time) t_conv, the open-close switch SW1 is open in response to the switch control signal from the switch control circuit 11, so that the current Iin charges the capacitor C1 and is subjected to analog-to-digital conversion. The detailed operation of the analog-to-digital conversion circuit 8 is explained below.

Initially, the discharge circuit 14 discharges certain electric charges Iref×t_clk (precharge operation). Iref represents a reference current from the current source 15, and t_clk represents a cycle of the clock signal clk. A power source voltage Vdd is applied to the input end of the current source 15 of the discharge circuit 14.

Thereafter, the charge circuit 9 (integration device) which is an integration circuit is charged by the current Iin. When charging makes the output voltage vsig of the charge circuit 9 larger than the reference voltage vref, the comparison signal comp from the comparison circuit 10 comes to have a Hi voltage.

The comparison signal comp is delayed by a D flip-flop D-FF in the digital value control circuit 12, and becomes an electric charge signal Scharge. When the electric charge signal Scharge is inputted to the open-close switch SW2 of the discharge circuit 14 and the open-close switch SW2 is closed, certain electric charges (Iref×t_clk) are discharged from the discharge circuit 14. By the counter 13 counting the number of discharges per predetermined time, a value corresponding to the input electric charges is digitally outputted as a digital value ADCOUT.

Figure 10:
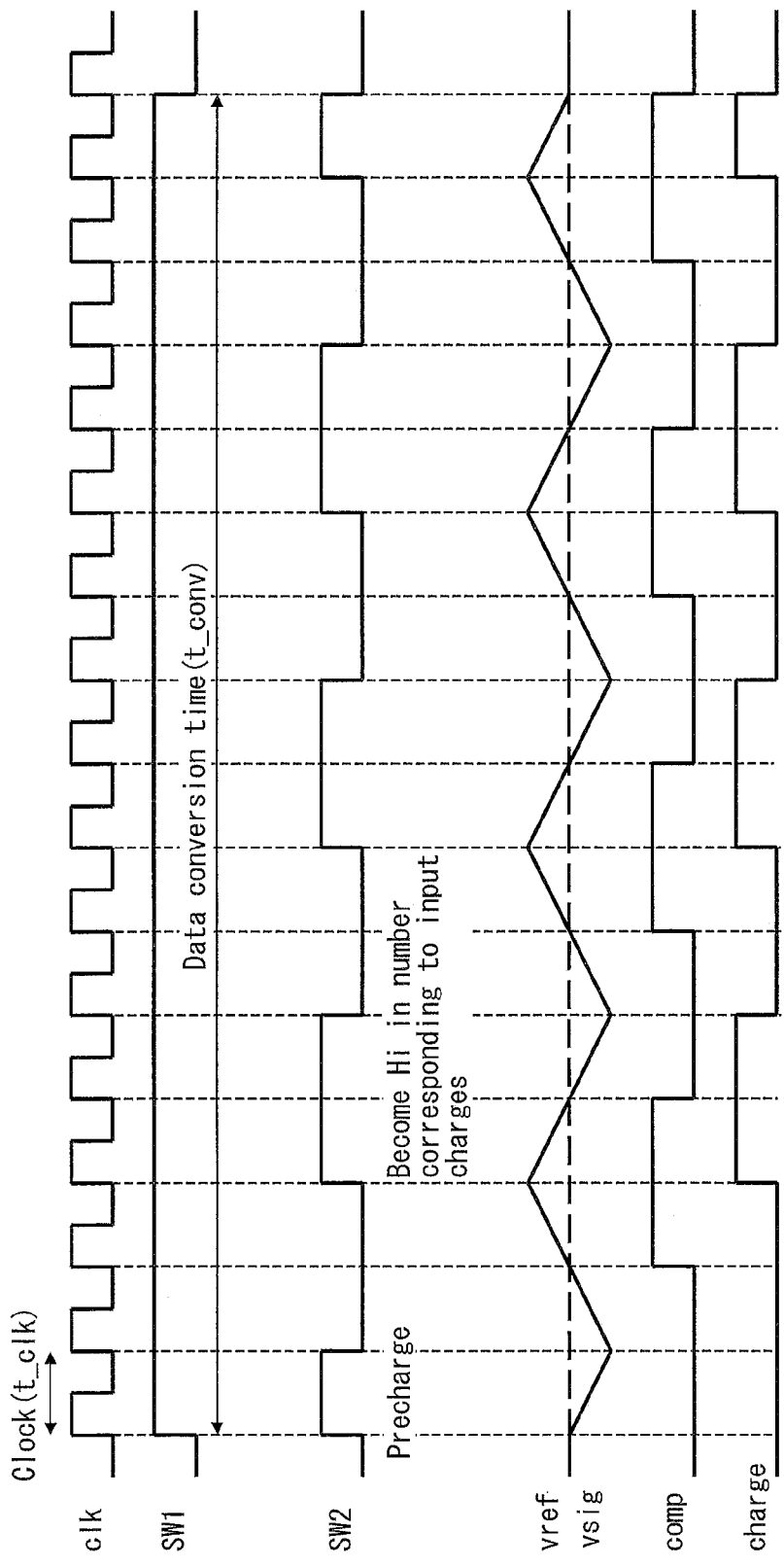
FIG. 10 is a waveform chart showing an operation of the integrating-type analog-to-digital conversion circuit.

FIG. 10 is a waveform chart showing the operation of the integrating-type analog-to-digital conversion circuit 8 in accordance with one embodiment of the present invention. The analog-to-digital conversion circuit 8 operates in such a manner that the total amount of charge of the current Iin and the total amount of discharge of Iref×t_clk are equal to each other. Accordingly, equations (57) and (58) below are met.

$$\text{The total amount of charge} = I\text{in} \times t\_\text{conv} \quad (57)$$

$$\text{The total amount of discharge} = I\text{ref} \times t\_\text{clk} \times N\text{count} \quad (58)$$

Since the net charge is equal to the net discharge, equation (59) below is met.

$$N\text{count} = (I\text{in} \times t\_\text{conv})/(I\text{ref} \times t\_\text{clk}) \quad (59)$$

In equations (57) to (59), t_clk represents the cycle of the clock signal clk, t_conv represents a measurement period (data conversion time), Ncount represents the number of counted discharges (count number), and Iref represents a reference current.

Based on equation (57), the minimum resolution of the analog-to-digital conversion circuit 8 is determined by (Iref×t_clk).

Assume that charging is made for t_clk×$2^n$ period in equation (60). At that time, equation (61) below is derived from equation (57).

$$\text{Measurement period } t\_\text{conv} = t\_\text{clk} \times 2^n \ (n \text{ is resolution}) \quad (60)$$

$$N\text{count} = I\text{in}/I\text{ref} \times 2^n \quad (61)$$

For example, in a case where the resolution n is 16 bits, the count number Ncount is outputted as a value ranging from 0 to 65535 in accordance with the current Iin. As an analog-to-digital conversion circuit including the ADC 2, the integrating-type analog-to-digital conversion circuit 8 is employed. This enables analog-to-digital conversion with a wide dynamic range and high resolution derived from the integrating-type analog-to-digital conversion circuit.

[Backlight Control Circuit of Liquid Crystal Panel 16]

Figure 11:
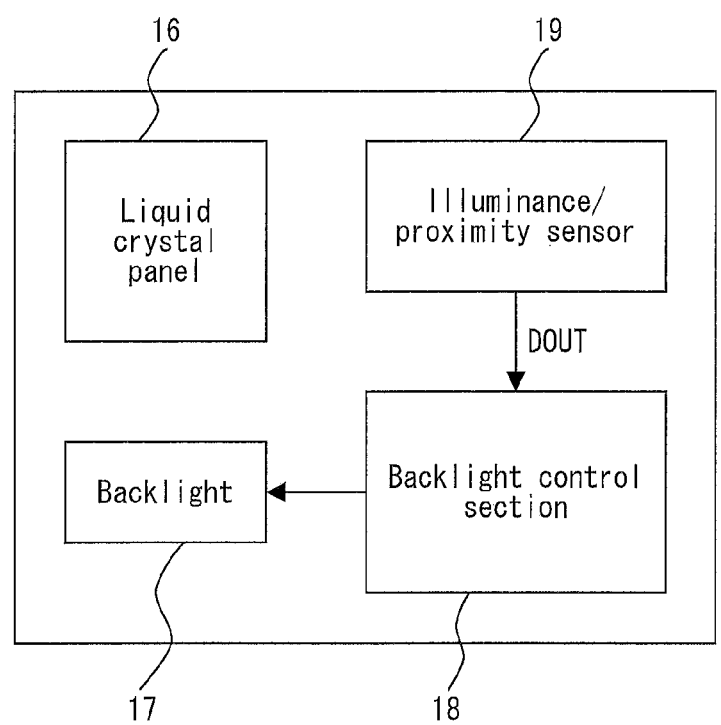
FIG. 11 is a block diagram showing a backlight control circuit of a liquid crystal panel including the sensor device in FIG. 1 or 4 as an illuminance sensor.

FIG. 11 is a block diagram showing a backlight control circuit of the liquid crystal panel 16 in accordance with the present embodiment.

The backlight control circuit includes a liquid crystal panel 16 for displaying a screen, a backlight 17 for emitting light to the liquid crystal panel 16, a backlight control section 18 for controlling luminance of the backlight 17, and an illuminance sensor 19 (proximity sensor 19, range-finding sensor 19). The illuminance sensor 19 includes the sensor device 1 or 31.

The backlight control section 18 controls luminance of the backlight 17 in accordance with a digital output signal Dout from an analog-to-digital conversion circuit which is included in the illuminance sensor 19 and which includes the ADC 2. Specifically, when the digital output signal Dout from the analog-to-digital conversion circuit included in the illuminance sensor 19 is changed to be in a Hi level, the backlight control section 18 increases luminance of the backlight 17 by a first predetermined value. When the digital output signal Dout is changed to be in a Low level, the backlight control section 18 drops luminance of the backlight 17 by a second predetermined value. When the digital output signal Dout does not change its level, the backlight control section 18 maintains luminance of the backlight 17.

As described above, the analog-to-digital conversion circuit including the ADC 2 is applicable to control of a backlight in a liquid crystal panel of a mobile phone and to control of a backlight in a liquid crystal panel of a digital camera (digital still camera).

[Measurement Period t_conv]

In a case where the proximity sensors 1 and 31 in accordance with the present embodiment operate as illuminance sensors, it is desirable that the measurement period t_conv of the analog-to-digital conversion circuit 8, which includes a period required for charging the capacitor C1 of the charge circuit 9, is set to a multiple of 20 msec (including 20 msec) or a multiple of 16.66 msec (including 16.66 msec). The reason is as follows.

An example of the outside ambient light such as sunlight is light emitted from a fluorescent lamp. The light from a fluorescent lamp oscillates with a cycle corresponding to 50 Hz or 60 Hz which is the frequency of a voltage supplied to the fluorescent lamp from a commercial power source in order to cause the fluorescent lamp to operate. Consequently, the light from a fluorescent lamp includes a frequency component of 50 Hz or 60 Hz.

Here, assume that illuminance of the light from a fluorescent lamp is measured using the illuminance sensor. In this case, a time required for measurement of the illuminance depends on integration by the analog-to-digital conversion circuit 8, and is obtained as a measurement period t_conv of the analog-to-digital conversion circuit 8 of the illuminance sensor. If the measurement period t_conv is shorter than the cycle of 20 msec which is the inverse number of the frequency of 50 Hz or than the cycle 16.66 msec which is the inverse number of the frequency of 60 Hz, measurement of the illuminance cannot be performed accurately.

For this reason, a conventional illuminance sensor employing an integrating-type analog-to-digital conversion circuit carries out a long-time integration. With this, a time for measurement of illuminance, which corresponds to the measurement period t_conv in accordance with the present embodiment, is made sufficiently long, thereby measuring illuminance accurately.

In cases where the proximity sensors 1 and 31 in accordance with the present embodiment determine whether the detection target 21 is positioned proximately or not, the light from a fluorescent lamp becomes a disturbing noise which disturbs making the determination accurately. Therefore, it is desirable that in the proximity sensors 1 and 31, the influence of the light from a fluorescent lamp is removed.

For this reason, in the proximity sensors 1 and 31 in accordance with the present embodiment, the measurement period t_conv is set to a multiple of the cycle of 20 msec (millisecond) (including 20 msec) which is the inverse number of the frequency of 50 Hz (Hertz) or a multiple of the cycle of 16.66 msec (millisecond) (including 16.66 msec) which is the inverse number of the frequency of 60 Hz (Hertz).

This removes the influence of the light from a fluorescent lamp which light oscillates with a cycle being the inverse number of 50 Hz or 60 Hz which is the frequency of a voltage supplied to the fluorescent lamp from a commercial power source in order to cause the fluorescent lamp to operate. Consequently, it is possible to accurately measure the illuminance and accurately determine whether the detection target 21 is positioned proximately or not.

Application Examples

Figure 13:
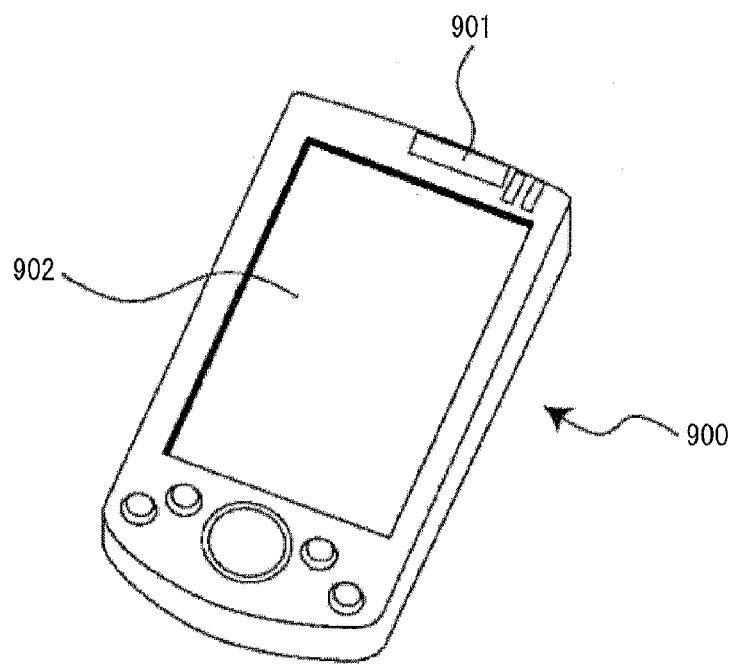
FIG. 13 is a perspective view showing a mobile phone which is an electronic apparatus in accordance with an embodiment of the present invention.
Figure 14:
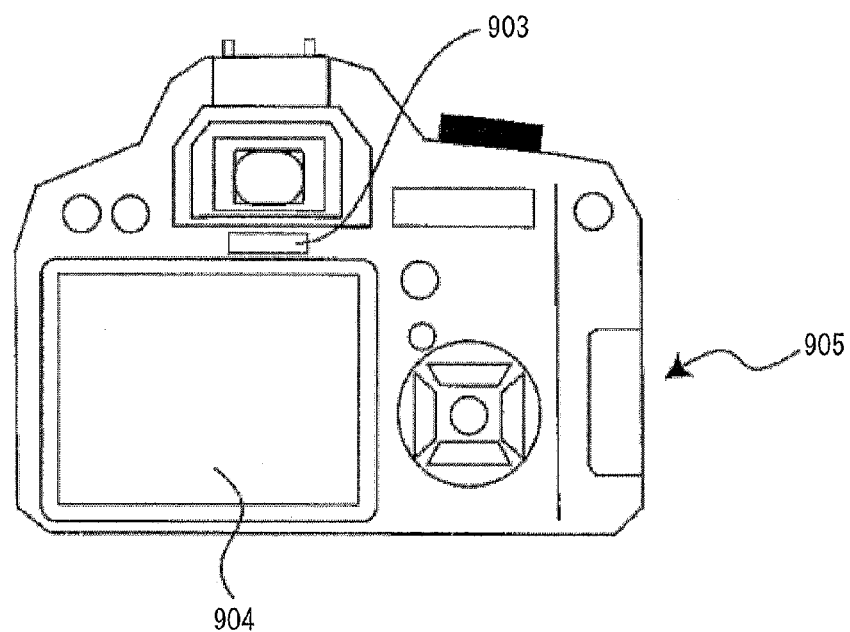
FIG. 14 is an elevation view showing a digital camera which is an electronic apparatus in accordance with an embodiment of the present invention.
Figure 17:
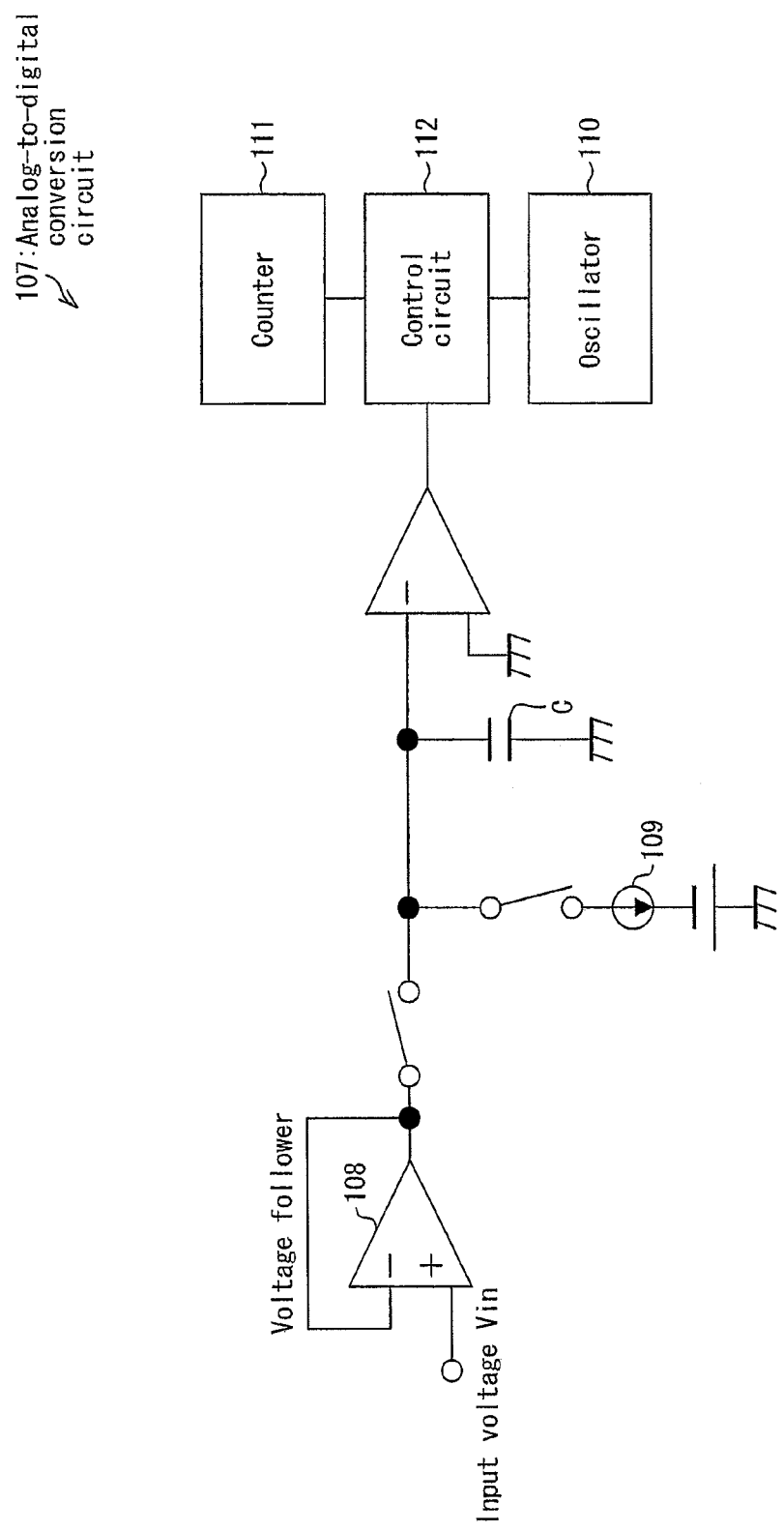
FIG. 17 is a circuit diagram showing a configuration of an analog-to-digital conversion circuit to which the teaching of Patent Literature 2 was applied.

FIGS. 13 and 14 show examples of an electronic apparatus in accordance with the present embodiment. FIG. 13 is a perspective view showing a mobile phone 900 which is an electronic apparatus in accordance with the present embodiment. FIG. 14 is an elevation view showing a digital camera 905 which is an electronic apparatus in accordance with the present embodiment.

As shown in FIG. 13, the mobile phone 900 includes one of the sensor devices 1 and 31 which can serve as the proximity sensor 901 in a first step. Accordingly, the proximity sensor 901 can accurately determine whether the detection target 21 is positioned proximately or not without malfunction when irradiated with outside ambient light such as sunlight. Therefore, the mobile phone 900 can operate normally without malfunction.

Further, the mobile phone 900 includes a liquid crystal monitor 902 employing the liquid crystal panel 16. In accordance with whether the detection target 21 is positioned proximately or not, display of the liquid crystal monitor 902 can be switched between on and off. Further, an LED backlight (backlight 17) for emitting light to the liquid crystal monitor 902 from the backside thereof (irradiating the liquid crystal monitor 902 with light from the backside thereof) can be switched between on and off.

Luminance of the LED backlight is controlled by a backlight control circuit of the mobile phone 900 (backlight control section 18 included in the mobile phone 900 for example). When a digital output signal of an analog-to-digital conversion circuit (e.g. integrating-type analog-to-digital conversion circuit 8) of the sensor devices 1 and 31 is changed to be in a Hi level, the backlight control circuit increases luminance of the backlight by a first predetermined value. When the digital output signal is changed to be in a Low level, the backlight control circuit drops the luminance of the backlight by a second predetermined value. When the digital output signal is not changed, the backlight control circuit maintains the luminance of the backlight.

As shown in FIG. 14, the digital camera 905 includes one of the sensor devices 1 and 31 which can serve as the proximity sensor 903 in a second step following a first step. Accordingly, the proximity sensor 903 can accurately determine whether the detection target 21 is positioned proximately or not without malfunction when irradiated with outside ambient light such as sunlight. Therefore, the digital camera 905 can operate normally without malfunction.

Further, the digital camera 905 includes a liquid crystal monitor 904 employing the liquid crystal panel 16. In accordance with whether the detection target 21 is positioned proximately or not, display of the liquid crystal monitor 904 can be switched between on and off. Further, an LED backlight (backlight 17) for emitting light to the liquid crystal monitor 904 from the backside thereof (irradiating the liquid crystal monitor 904 with light from the backside thereof) can be switched between on and off.

Luminance of the LED backlight is controlled by a backlight control circuit of the digital camera 905 (backlight control section 18 included in the digital camera 905 for example). When a digital output signal of an analog-to-digital conversion circuit (e.g. integrating-type analog-to-digital conversion circuit 8) of the sensor devices 1 and 31 is changed to be in a Hi level, the backlight control circuit increases luminance of the backlight by a first predetermined value. When the digital output signal is changed to be in a Low level, the backlight control circuit drops the luminance of the backlight by a second predetermined value. When the digital output signal is not changed, the backlight control circuit maintains the luminance of the backlight.

Summary of Embodiments

As described above, a sensor device in accordance with the present embodiment is a sensor device capable of serving as a proximity sensor for determining whether a detection target is positioned proximately or not, comprising: a light emitting element for emitting, to a predetermined space, light to be reflected by the detection target positioned proximately; an analog-to-digital conversion section for subjecting an analog input current to analog-to-digital conversion; a light receiving element which is a photodiode, whose cathode is connected with an input terminal of the analog-to-digital conversion section and whose anode is grounded electrically; a comparison section for receiving, at one of two input terminals, a result of analog-to-digital conversion by the analog-to-digital conversion section and receiving a predetermined threshold at the other of the two input terminals, comparing the result with the predetermined threshold, and when the result is larger than the predetermined threshold, outputting a signal indicating that the detection target is positioned proximately and when the result is not larger than the predetermined threshold, outputting a signal indicating that the detection target is not positioned proximately; a storage section for storing the result; a change-over switch whose first terminal is connected with said one of the two input terminals of the comparison section, whose second terminal is connected with an input terminal of the analog-to-digital conversion section and an input terminal of the storage section, and whose third terminal is grounded electrically, the change-over switch connecting the first terminal with the second terminal or connecting the first terminal with the third terminal so as to make said one of the two input terminals of the comparison section grounded electrically; an open-close switch whose one end is connected with the cathode of the light receiving element and the input terminal of the analog-to-digital conversion section; a variable current source whose input terminal receives application of a power source voltage and whose output terminal is connected with the other end of the open-close switch; and a switch control section for outputting, to a control input terminal of the open-close switch, a first control signal for controlling opening and closing of the open-close switch and outputting, to a control input terminal of the change-over switch, a second control signal for controlling switching of the change-over switch.

Another sensor device in accordance with the present embodiment is a sensor device capable of serving as a proximity sensor for determining whether a detection target is positioned proximately or not, comprising: a light emitting element for emitting, to a predetermined space, light to be reflected by the detection target positioned proximately; an analog-to-digital conversion section for subjecting an analog input current to analog-to-digital conversion; a light receiving element which is a photodiode, whose cathode is connected with an input terminal of the analog-to-digital conversion section and whose anode is grounded electrically; a storage and subtraction section for storing a first input of the result of analog-to-digital conversion by the analog-to-digital conversion section, upon second input of the result of analog-to-digital conversion, outputting the first input of the result of analog-to-digital conversion, and upon third input of the result of the analog-to-digital conversion, outputting a subtraction value obtained by subtracting the third input of the result of analog-to-digital conversion from the second input of the result of analog-to-digital conversion, a comparison section for receiving, at one of two input terminals, an output from the storage and subtraction section and receiving a predetermined threshold at the other of the two input terminals, comparing the output from the storage and subtraction section with the predetermined threshold, and when the output from the storage and subtraction section is larger than the predetermined threshold, outputting a signal indicating that the detection target is positioned proximately and when the output from the storage and subtraction section is not larger than the predetermined threshold, outputting a signal indicating that the detection target is not positioned proximately; a storage section for storing the result of analog-to-digital conversion; a change-over switch whose first terminal is connected with an input terminal of the storage and subtraction section, whose second terminal is connected with an input terminal of the analog-to-digital conversion section and an input terminal of the storage section, and whose third terminal is grounded electrically, the change-over switch connecting the first terminal with the second terminal or connecting the first terminal with the third terminal so as to make the input terminal of the storage and subtraction section grounded electrically; an open-close switch whose one end is connected with the cathode of the light receiving element and the input terminal of the analog-to-digital conversion section; a variable current source whose input terminal receives application of a power source voltage and whose output terminal is connected with the other end of the open-close switch; and a switch control section for outputting, to a control input terminal of the open-close switch, a first control signal for controlling opening and closing of the open-close switch and outputting, to a control input terminal of the change-over switch, a second control signal for controlling switching of the change-over switch.

Therefore, the present invention can provide a sensor device and an electronic apparatus each of which does not make malfunction derived from outside ambient light such as sunlight.

The sensor device may be arranged so as to determine whether the detection target is positioned proximately or not in such a manner that in a first step, the light emitting element is turned off, the open-close switch is opened, the change-over switch makes said one of the two input terminals of the comparison section grounded electrically, the analog-to-digital conversion section subjects a current from the light receiving element to analog-to-digital conversion to obtain first data as the result of analog-to-digital conversion and outputs the first data to the storage section, the storage section outputs, to the variable current source, a current control signal indicative of intensity of the current which is outputted from the light receiving element and which corresponds to the first data, and the variable current source outputs, upon reception of the current control signal, a current equal to the current which is outputted from the light receiving element and which corresponds to the first data, and in a second step following the first step, the light emitting element is turned on and the open-close switch is closed, and the change-over switch connects said one of two input terminals of the comparison section with an output terminal of the analog-to-digital conversion section.

In the first step, the first data is outputted to the storage section. This enables setting the output current from the variable current source.

Further, in the second step, a difference current between the output current from the variable current source and an output current from the light receiving element when the light emitting element is turned on and the open-close switch is closed can be supplied to the analog-to-digital conversion section.

The difference current is a current from which the output current from the variable current source was removed. The removed output current from the variable current source is equal to the output current from the light receiving element receiving the outside light when the light emitting element is turned off.

Consequently, determination of whether the detection target is positioned proximately or not can be made accurately since the influence of the outside light is removed.

Therefore, the present invention can provide a sensor device which does not make malfunction derived from outside ambient light such as sunlight.

The sensor device may be arranged so as to determine whether the detection target is positioned proximately or not in such a manner that in a first step, the light emitting element is turned off, the open-close switch is opened, the change-over switch makes an input terminal of the storage and subtraction section grounded electrically, the analog-to-digital conversion section subjects a current from the light receiving element to analog-to-digital conversion to obtain first data as the result of analog-to-digital conversion and outputs the first data to the storage section, the storage section outputs, to the variable current source, a current control signal indicative of intensity of the current which is outputted from the light receiving element and which corresponds to the first data, and the variable current source outputs, upon reception of the current control signal, a current equal to the current which is outputted from the light receiving element and which corresponds to the first data, in a second step following the first step, the light emitting element is turned on and the open-close switch is closed, and the change-over switch connects the input terminal of the storage and subtraction section with an output terminal of the analog-to-digital conversion section, and in a third step following the second step, the light emitting element is turned off and the open-close switch is closed.

In the first step, the first data is outputted to the storage section. This enables setting the output current from the variable current source.

Further, in the second step, a first difference current between the output current from the variable current source and an output current from the light receiving element when the light emitting element is turned on and the open-close switch is closed can be supplied to the analog-to-digital conversion section.

Further, in the third step, a second difference current between the output current from the variable current source and an output current from the light receiving element when the light emitting element is turned off and the open-close switch is closed can be supplied to the analog-to-digital conversion section.

The first and second difference currents are currents from which the output current from the variable current source was removed. The removed output current from the variable current source is equal to the output current from the light receiving element receiving the outside light when the light emitting element is turned off.

Consequently, determination of whether the detection target is positioned proximately or not can be made accurately since the influence of the outside light is removed.

Therefore, the present invention can provide a sensor device which does not make malfunction derived from outside ambient light such as sunlight.

The sensor device of the present invention may be arranged such that in the first step, an upper limit of the result of analog-to-digital conversion by the analog-to-digital conversion section is set to a predetermined first upper limit, in the second step, the upper limit of the result of analog-to-digital conversion by the analog-to-digital conversion section is set to a predetermined second upper limit, and the predetermined first upper limit is higher than the predetermined second upper limit.

Consequently, in the first step, even when the sensor device is irradiated with outside light with extremely high illuminance which would make data corresponding to the illuminance exceed the second full scale, the first data does not reach the first full scale and the result of analog-to-digital conversion by the analog-to-digital conversion section does not get saturated.

Further, in the second step, a current supplied to the analog-to-digital conversion section is a difference current which is a difference between the output from the variable current source and the output current from the light receiving element when the light emitting element is turned on and the open-close switch is closed.

Consequently, the difference current does not include the output current from the variable current source which output current results from the light with extremely high illuminance. Therefore, the present invention can provide a sensor device which does not make malfunction derived from outside ambient light with extremely high illuminance such as sunlight.

The sensor device of the present invention may be arranged such that in the first step, an upper limit of the result of analog-to-digital conversion by the analog-to-digital conversion section is set to a predetermined first upper limit, in the second step and the third step, the upper limit of the result of analog-to-digital conversion by the analog-to-digital conversion section is set to a predetermined second upper limit, and the predetermined first upper limit is higher than the predetermined second upper limit.

Consequently, in the first step, even when the sensor device is irradiated with outside light with extremely high illuminance which would make data corresponding to the illuminance exceed the second full scale, the first data does not reach the first full scale and the result of analog-to-digital conversion by the analog-to-digital conversion section does not get saturated.

Further, in the second step, a current supplied to the analog-to-digital conversion section is a first difference current which is a difference between the output from the variable current source and the output current from the light receiving element when the light emitting element is turned on and the open-close switch is closed.

Further, in the third step, a current supplied to the analog-to-digital conversion section is a second difference current which is a difference between the output from the variable current source and the output current from the light receiving element when the light emitting element is turned off and the open-close switch is closed.

Consequently, the first difference current and the second difference current do not include the output current from the variable current source which output current results from the light with extremely high illuminance. Therefore, the present invention can provide a sensor device which does not make malfunction derived from outside ambient light with extremely high illuminance such as sunlight.

At least one of the above sensor devices may be arranged such that the result of analog-to-digital conversion by the analog-to-digital conversion section is inversely proportional to a distance between said each of the sensor devices and the detection target.

Accordingly, said at least one of the sensor devices capable of serving as a proximity sensor can serve as a range-finding sensor by calculating the distance from the result of analog-to-digital conversion.

Said at least one of the above sensor devices may be arranged such that the result of analog-to-digital conversion by the analog-to-digital conversion section is directly proportional to illuminance of reflected light being a result of reflection by the detection target.

Accordingly, said at least one of the sensor devices capable of serving as a proximity sensor can serve as an illuminance sensor by calculating the illuminance from the result of analog-to-digital conversion.

Said at least one of the above sensor devices may be arranged such that the analog-to-digital conversion section is an integrating-type analog-to-digital conversion section for digitally converting an analog input current, and the analog-to-digital conversion section includes: a charge section including (i) a capacitor for storing charges corresponding to the analog input current and (ii) a differential amplifier having an inverting input terminal which is connected with one end of the capacitor and to which the analog input current is inputted, a non-inverting input terminal grounded electrically, and an output terminal which is connected with the other end of the capacitor and from which an output voltage is outputted; a discharge section for discharging the charges stored in the capacitor; and an output voltage comparison section including a voltage source for outputting a reference voltage and a switch for opening and closing between an output of the voltage source and an output of the charge section, the output voltage comparison section comparing the output voltage from the differential amplifier of the charge section with the reference voltage.

The integrating-type analog-to-digital conversion section is employed as the analog-to-digital conversion section. This enables analog-to-digital conversion with a wide dynamic range and high resolution derived from the integrating-type analog-to-digital conversion section.

The sensor device may be arranged such that a period for measurement by the integrating-type analog-to-digital conversion section, which period includes a period for charging the capacitor, is a multiple of a cycle of 20 millisecond which is an inverse number of a frequency of 50 Hertz or a multiple of a cycle of 16.6 millisecond which is an inverse number of a frequency of 60 Hertz.

The sensor device may be arranged such that the period for measurement is the cycle of 20 millisecond which is an inverse number of a frequency of 50 Hertz or the cycle of 16.6 millisecond which is an inverse number of a frequency of 60 Hertz.

In a case where said at least one of the above sensor devices serve as an illuminance sensor, it is desirable that the period for measurement by the integrating-type analog-to-digital conversion section is a multiple of a cycle of 20 millisecond (including a cycle of 20 millisecond) which is an inverse number of a frequency of 50 Hertz or a multiple of a cycle of 16.6 millisecond (including a cycle of 16.6) which is an inverse number of a frequency of 60 Hertz.

An example of the outside light is light emitted from a fluorescent lamp. The light from a fluorescent lamp oscillates with a cycle corresponding to 50 Hz or 60 Hz which is the frequency of a voltage supplied to the fluorescent lamp from a commercial power source in order to cause the fluorescent lamp to operate. Consequently, the light from a fluorescent lamp includes a frequency component of 50 Hz or 60 Hz.

Here, assume that illuminance of the light from a fluorescent lamp is measured using the illuminance sensor. In this case, if a measurement period of the illuminance sensor, i.e. a time required for measurement of the illuminance (which depends on integration by the analog-to-digital conversion circuit) is shorter than the cycle of 20 msec which is the inverse number of the frequency of 50 Hz or than the cycle 16.66 msec which is the inverse number of the frequency of 60 Hz, measurement of the illuminance cannot be performed accurately.

For this reason, a conventional illuminance sensor employing an integrating-type analog-to-digital conversion circuit carries out a long-time integration. With this, a time for measurement of illuminance, which corresponds to the measurement period is made sufficiently long, thereby measuring illuminance accurately.

In a case where said at least one of the above sensor devices determines whether the detection target is positioned proximately or not, the light from a fluorescent lamp becomes a disturbing noise which disturbs making the determination accurately. Therefore, it is desirable that in said at least one of the sensor devices, the influence of the light from a fluorescent lamp is removed.

For this reason, in said at least one of the sensor devices, the measurement period is set to a multiple of the cycle of 20 millisecond (including 20 millisecond) which is the inverse number of the frequency of 50 Hertz or a multiple of the cycle of 16.66 millisecond (including 16.66 millisecond) which is the inverse number of the frequency of 60 Hertz.

This removes the influence of the light from a fluorescent lamp which light oscillates with a cycle being the inverse number of 50 Hz or 60 Hz which is the frequency of a voltage supplied to the fluorescent lamp from a commercial power source in order to cause the fluorescent lamp to operate. Consequently, it is possible to accurately measure the illuminance and accurately determine whether the detection target is positioned proximately or not.

An electronic apparatus in accordance with the present embodiment is an electronic apparatus including: a liquid crystal panel for displaying a screen; a backlight for emitting light to the liquid crystal panel; a backlight control section for controlling luminance of the backlight; and one of the above sensor devices, in a case where a digital output signal from the analog-to-digital conversion section of the sensor device changes to be in a High level, the backlight control section increases luminance of light from the backlight by a first predetermined value, in a case where the digital output signal from the analog-to-digital conversion section of the sensor device changes to be in a Low level, the backlight control section drops luminance of light from the backlight by a second predetermined value, and in a case where the digital output signal from the analog-to-digital conversion section of the sensor device does not change, the backlight control section maintains luminance of light from the backlight.

The electronic apparatus may be a mobile phone or a digital camera.

The electronic apparatus in accordance with the present embodiment includes one of the above sensor devices capable of serving as a proximity sensor. The proximity sensor can accurately determine whether the detection target is positioned proximately or not without malfunction even when irradiated with the outside light. Accordingly, the electronic apparatus can operate normally without malfunction.

The present invention is not limited to the description of the embodiments above, but may be altered by a skilled person within the scope of the claims. An embodiment based on a proper combination of technical means disclosed in different embodiments is encompassed in the technical scope of the present invention.

INDUSTRIAL APPLICABILITY

The sensor device of the present invention is applicable to a proximity sensor, a range-finding sensor, and illuminance sensor mounted on an electronic apparatus. In particular, the sensor device of the present invention is preferably applicable to mobile phones and digital cameras.

REFERENCE SIGNS LIST 1, 31. Sensor device
2. ADC (Analog-to-digital conversion section)
3. Comparison circuit (comparison section)
4. Storage circuit (storage section)
6. Variable current source
8. Analog-to-digital conversion circuit (integrating-type analog-to-digital conversion circuit)
9. Charge circuit (charge section)
10. Comparison circuit (output voltage comparison section)
11. Switch control circuit
12. Digital value control circuit
13. Counter
14. Discharge circuit (discharge section)
15. Current source
16. Liquid crystal panel
17. Backlight
18. Backlight control section
19. Illuminance sensor
20. Control circuit
21. Detection target
22. Reflected light
32. Storage and subtraction circuit (storage and subtraction section)
50. Switch control circuit (switch control section)
900. Mobile phone
901, 903. Proximity sensor
902, 904. Liquid crystal monitor
905. Digital camera
A. Light-receiving sensibility
ADCOUT. Digital value (result of AD conversion)
AMP1. Differential amplifier
C, C1. Capacitor
D-FF. D flip-flop
Dout. Digital output signal
Data_th. Threshold
Data0. Data (first data)
Data1. Data (second data)
Data2. Data (third data)
Data1–Data2 (difference data)
E. Radiant intensity
Ee. Radiant illuminance
I1. Current (output current from variable current source)
Iin. Current (output current from photodiode)
Iin–I1. Difference current (difference current, first difference current, second difference current)
Iref. Reference current
L. Distance
LED. Light emitting diode (light emitting element)
PD. Photodiode (light receiving element)
S. Area of light-receiving surface
SW0-SW2. Open-close switch
SW0'. Change-over switch Sc. Current control signal
V1. Voltage source
Vdd. Power source voltage
a1, a2. Proportionality constant
Scharge. Charge signal
clk. Clock signal
comp. Comparison signal
Ncount. Count number
n. Resolution
t_clk. Cycle of clock signal
t_conv. Measurement period
vref. Reference voltage
vsig. Output voltage
η. Reflectance

The invention claimed is:

1. A sensor device capable of serving as a proximity sensor for determining whether a detection target is positioned proximately or not, comprising:

a light emitting element for emitting, to a predetermined space, light to be reflected by the detection target positioned proximately;

an analog-to-digital conversion section for subjecting an analog input current to analog-to-digital conversion;

a light receiving element which is a photodiode, whose cathode is connected with an input terminal of the analog-to-digital conversion section and whose anode is grounded electrically;

a comparison section for receiving, at one of two input terminals, a result of analog-to-digital conversion by the analog-to-digital conversion section and receiving a predetermined threshold at the other of the two input terminals, comparing the result with the predetermined threshold, and when the result is larger than the predetermined threshold, outputting a signal indicating that the detection target is positioned proximately and when the result is not larger than the predetermined threshold, outputting a signal indicating that the detection target is not positioned proximately;

a storage section for storing the result;

a change-over switch whose first terminal is connected with said one of the two input terminals of the comparison section, whose second terminal is connected with an input terminal of the analog-to-digital conversion section and an input terminal of the storage section, and whose third terminal is grounded electrically, the change-over switch connecting the first terminal with the second terminal or connecting the first terminal with the third terminal so as to make said one of the two input terminals of the comparison section grounded electrically;

an open-close switch whose one end is connected with the cathode of the light receiving element and the input terminal of the analog-to-digital conversion section;

a variable current source whose input terminal receives application of a power source voltage and whose output terminal is connected with the other end of the open-close switch; and a switch control section for outputting, to a control input terminal of the open-close switch, a first control signal for controlling opening and closing of the open-close switch and outputting, to a control input terminal of the change-over switch, a second control signal for controlling switching of the change-over switch.

2. The sensor device as set forth in claim 1, wherein the sensor device determines whether the detection target is positioned proximately or not in such a manner that in a first step,
the light emitting element is turned off, the open-close switch is opened,
the change-over switch connects the first terminal with the third terminal,
the analog-to-digital conversion section subjects a current from the light receiving element to analog-to-digital conversion to obtain first data as the result of analog-to-digital conversion and outputs the first data to the storage section,
the storage section supplies, to the variable current source, a current control signal indicative of intensity of the current which is outputted from the light receiving element and which corresponds to the first data, and
the variable current source outputs, in accordance with the current control signal, a current set to be equal to the current which is outputted from the light receiving element and which corresponds to the first data, and in a second step following the first step,
the light emitting element is turned on and the open-close switch is closed, and
the change-over switch connects the first terminal with the second terminal.

3. The sensor device as set forth in claim 2, wherein
in the first step, an upper limit of the result of analog-to-digital conversion by the analog-to-digital conversion section is set to a predetermined first upper limit,
in the second step, the upper limit of the result of analog-to-digital conversion by the analog-to-digital conversion section is set to a predetermined second upper limit, and
the predetermined first upper limit is higher than the predetermined second upper limit.

4. The sensor device as set forth in claim 1, wherein the result of analog-to-digital conversion by the analog-to-digital conversion section is inversely proportional to a distance between the sensor device and the detection target.

5. The sensor device as set forth in claim 1, wherein the result of analog-to-digital conversion by the analog-to-digital conversion section is directly proportional to illuminance of reflected light being a result of reflection by the detection target.

6. The sensor device as set forth in claim 1, wherein
the analog-to-digital conversion section is an integrating-type analog-to-digital conversion section for digitally converting an analog input current, and
the analog-to-digital conversion section includes:
a charge section including (i) a capacitor for storing charges corresponding to the analog input current and (ii) a differential amplifier having an inverting input terminal which is connected with one end of the capacitor and to which the analog input current is inputted, a non-inverting input terminal grounded electrically, and an output terminal which is connected with the other end of the capacitor and from which an output voltage is outputted;
a discharge section for discharging the charges stored in the capacitor; and
an output voltage comparison section including a voltage source for outputting a reference voltage and a switch for opening and closing between an output of the voltage source and an output of the charge section, the output voltage comparison section comparing the output voltage from the differential amplifier of the charge section with the reference voltage.

7. The sensor device as set forth in claim 6, wherein a period for measurement by the integrating-type analog-todigital conversion section, which period includes a period for charging the capacitor, is a multiple of a cycle of 20 millisecond which is an inverse number of a frequency of 50 Hertz or a multiple of a cycle of 16.6 millisecond which is an inverse number of a frequency of 60 Hertz.

8. The sensor device as set forth in claim 7, wherein the period for measurement is the cycle of 20 millisecond which is an inverse number of a frequency of 50 Hertz or the cycle of 16.6 millisecond which is an inverse number of a frequency of 60 Hertz.

9. An electronic apparatus, comprising:
a liquid crystal panel for displaying a screen;
a backlight for emitting light to the liquid crystal panel;
a backlight control section for controlling luminance of the backlight; and
a sensor device as set forth in claim 1,
in a case where a digital output signal from the analog-to-digital conversion section of the sensor device changes to be in a High level, the backlight control section increases luminance of light from the backlight by a first predetermined value,
in a case where the digital output signal from the analog-to-digital conversion section of the sensor device changes to be in a Low level, the backlight control section drops luminance of light from the backlight by a second predetermined value, and
in a case where the digital output signal from the analog-to-digital conversion section of the sensor device does not change, the backlight control section maintains luminance of light from the backlight.

10. The electronic apparatus as set forth in claim 9, being a mobile phone or a digital camera.

11. A sensor device capable of serving as a proximity sensor for determining whether a detection target is positioned proximately or not, comprising:
a light emitting element for emitting, to a predetermined space, light to be reflected by the detection target positioned proximately;
an analog-to-digital conversion section for subjecting an analog input current to analog-to-digital conversion;
a light receiving element which is a photodiode, whose cathode is connected with an input terminal of the analog-to-digital conversion section and whose anode is grounded electrically;
a storage and subtraction section for storing a first input of the result of analog-to-digital conversion by the analog-to-digital conversion section, upon second input of the result of analog-to-digital conversion, outputting the first input of the result of analog-to-digital conversion, and upon third input of the result of the analog-to-digital conversion, outputting a subtraction value obtained by subtracting the third input of the result of analog-to-digital conversion from the second input of the result of analog-to-digital conversion,
a comparison section for receiving, at one of two input terminals, an output from the storage and subtraction section and receiving a predetermined threshold at the other of the two input terminals, comparing the output from the storage and subtraction section with the predetermined threshold, and when the output from the storage and subtraction section is larger than the predetermined threshold, outputting a signal indicating that the detection target is positioned proximately and when the output from the storage and subtraction section is not larger than the predetermined threshold, outputting a signal indicating that the detection target is not positioned proximately;
a storage section for storing the result of analog-to-digital conversion;
a change-over switch whose first terminal is connected with an input terminal of the storage and subtraction section, whose second terminal is connected with an input terminal of the analog-to-digital conversion section and an input terminal of the storage section, and whose third terminal is grounded electrically, the change-over switch connecting the first terminal with the second terminal or connecting the first terminal with the third terminal so as to make the input terminal of the storage and subtraction section grounded electrically;
an open-close switch whose one end is connected with the cathode of the light receiving element and the input terminal of the analog-to-digital conversion section;
a variable current source whose input terminal receives application of a power source voltage and whose output terminal is connected with the other end of the open-close switch; and
a switch control section for outputting, to a control input terminal of the open-close switch, a first control signal for controlling opening and closing of the open-close switch and outputting, to a control input terminal of the change-over switch, a second control signal for controlling switching of the change-over switch.

12. The sensor device as set forth in claim 11, wherein the sensor device determines whether the detection target is positioned proximately or not in such a manner that
in a first step,
the light emitting element is turned off, the open-close switch is opened,
the change-over switch connects the first terminal with the third terminal,
the analog-to-digital conversion section subjects a current from the light receiving element to analog-to-digital conversion to obtain first data as the result of analog-to-digital conversion and outputs the first data to the storage section,
the storage section supplies, to the variable current source, a current control signal indicative of intensity of the current which is outputted from the light receiving element and which corresponds to the first data, and
the variable current source outputs, in accordance with the current control signal, a current set to be equal to the current which is outputted from the light receiving element and which corresponds to the first data,
in a second step following the first step,
the light emitting element is turned on and the open-close switch is closed, and
the change-over switch connects the first terminal with the second terminal, and
in a third step following the second step,
the light emitting element is turned off and the open-close switch is closed.

13. The sensor device as set forth in claim 12, wherein
in the first step, an upper limit of the result of analog-to-digital conversion by the analog-to-digital conversion section is set to a predetermined first upper limit,
in the second step and the third step, the upper limit of the result of analog-to-digital conversion by the analog-to-digital conversion section is set to a predetermined second upper limit, and
the predetermined first upper limit is higher than the predetermined second upper limit.

14. The sensor device as set forth in claim 11, wherein the result of analog-to-digital conversion by the analog-to-digital conversion section is inversely proportional to a distance between the sensor device and the detection target.

15. The sensor device as set forth in claim 11, wherein the result of analog-to-digital conversion by the analog-to-digital conversion section is directly proportional to illuminance of reflected light being a result of reflection by the detection target.

16. The sensor device as set forth in claim 11, wherein
the analog-to-digital conversion section is an integrating-type analog-to-digital conversion section for digitally converting an analog input current, and
the analog-to-digital conversion section includes:
  a charge section including (i) a capacitor for storing charges corresponding to the analog input current and (ii) a differential amplifier having an inverting input terminal which is connected with one end of the capacitor and to which the analog input current is inputted, a non-inverting input terminal grounded electrically, and an output terminal which is connected with the other end of the capacitor and from which an output voltage is outputted;
  a discharge section for discharging the charges stored in the capacitor; and
  an output voltage comparison section including a voltage source for outputting a reference voltage and a switch for opening and closing between an output of the voltage source and an output of the charge section, the output voltage comparison section comparing the output voltage from the differential amplifier of the charge section with the reference voltage.

17. The sensor device as set forth in claim 16, wherein a period for measurement by the integrating-type analog-to-digital conversion section, which period includes a period for charging the capacitor, is a multiple of a cycle of 20 millisecond which is an inverse number of a frequency of 50 Hertz or a multiple of a cycle of 16.6 millisecond which is an inverse number of a frequency of 60 Hertz.

18. The sensor device as set forth in claim 17, wherein the period for measurement is the cycle of 20 millisecond which is an inverse number of a frequency of 50 Hertz or the cycle of 16.6 millisecond which is an inverse number of a frequency of 60 Hertz.

19. An electronic apparatus, comprising:
  a liquid crystal panel for displaying a screen;
  a backlight for emitting light to the liquid crystal panel;
  a backlight control section for controlling luminance of the backlight; and
  a sensor device as set forth in claim 11,
  in a case where a digital output signal from the analog-to-digital conversion section of the sensor device changes to be in a High level, the backlight control section increases luminance of light from the backlight by a first predetermined value,
  in a case where the digital output signal from the analog-to-digital conversion section of the sensor device changes to be in a Low level, the backlight control section drops luminance of light from the backlight by a second predetermined value, and
  in a case where the digital output signal from the analog-to-digital conversion section of the sensor device does not change, the backlight control section maintains luminance of light from the backlight.

20. The electronic apparatus as set forth in claim 19, being a mobile phone or a digital camera.

* * * * *